United States Patent
Zhang et al.

(10) Patent No.: US 9,887,002 B1
(45) Date of Patent: Feb. 6, 2018

(54) DUMMY WORD LINE BIAS RAMP RATE DURING PROGRAMMING

(71) Applicant: SanDisk Technologies LLC, Plano, TX (US)

(72) Inventors: Zhengyi Zhang, Mountain View, CA (US); Yingda Dong, San Jose, CA (US)

(73) Assignee: SanDisk Technologies LLC, Plano, TX (US)

(*) Notice: Subject to any disclaimer, the term of this patent is extended or adjusted under 35 U.S.C. 154(b) by 0 days.

(21) Appl. No.: 15/584,584

(22) Filed: May 2, 2017

(51) Int. Cl.
| | |
|---|---|
| *G11C 7/12* | (2006.01) |
| *G11C 11/56* | (2006.01) |
| *G11C 16/16* | (2006.01) |
| *G11C 16/08* | (2006.01) |
| *G11C 16/04* | (2006.01) |
| *H01L 27/1158* | (2017.01) |
| *H01L 27/1157* | (2017.01) |

(52) U.S. Cl.
CPC ............ *G11C 11/5628* (2013.01); *G11C 7/12* (2013.01); *G11C 16/0483* (2013.01); *G11C 16/08* (2013.01); *G11C 16/16* (2013.01); *H01L 27/1157* (2013.01); *H01L 27/1158* (2013.01)

(58) Field of Classification Search
CPC .................................. G11C 7/12; G11C 16/10
USPC ............................................. 365/203, 185.24
See application file for complete search history.

(56) References Cited

U.S. PATENT DOCUMENTS

| | | | |
|---|---|---|---|
| 4,493,056 A * | 1/1985 | Mao ...................... | H01L 27/108 257/306 |
| 8,988,939 B2 | 3/2015 | Dunga et al. | |
| 9,245,642 B1 | 1/2016 | Chen et al. | |
| 9,286,994 B1 | 3/2016 | Chen et al. | |
| 9,299,450 B1 | 3/2016 | Pang et al. | |
| 9,312,010 B1 | 4/2016 | Yuan et al. | |
| 9,336,892 B1 | 5/2016 | Chen et al. | |
| 9,412,463 B1 | 8/2016 | Chen et al. | |
| 9,460,805 B1 | 10/2016 | Pang et al. | |
| 9,466,369 B1 | 10/2016 | Pang et al. | |
| 9,640,273 B1 | 5/2017 | Chen et al. | |
| 9,646,701 B2 * | 5/2017 | Lee ........................ | G11C 16/10 |
| 9,679,657 B2 * | 6/2017 | Park ....................... | G11C 16/12 |
| 2008/0130363 A1 * | 6/2008 | Hosono .............. | G11C 16/3418 365/185.2 |
| 2009/0180317 A1 * | 7/2009 | Kang .................. | G11C 11/5628 365/185.2 |
| 2010/0088575 A1 * | 4/2010 | Sharon ................ | G06F 11/1072 714/763 |
| 2011/0222339 A1 * | 9/2011 | Kim ....................... | G11C 16/10 365/185.2 |
| 2012/0300561 A1 * | 11/2012 | Yun ........................ | G11O 5/025 365/189.09 |

(Continued)

*Primary Examiner* — Michael Tran
(74) *Attorney, Agent, or Firm* — Vierra Magen Marcus LLP

(57) ABSTRACT

Apparatuses and techniques are described for reducing or eliminating program disturb in non-volatile storage. In one aspect, the ramp rate of a voltage applied to a dummy word line is reduced during programming of edge word lines. In one embodiment, a slower than normal ramp rate is used for a dummy word line when the word line selected for programming is an edge word line, but a normal ramp rate is used for the dummy word line when the word line selected for programming is a middle word line.

20 Claims, 18 Drawing Sheets

(56) References Cited

U.S. PATENT DOCUMENTS

| | | | |
|---|---|---|---|
| 2013/0128669 A1* | 5/2013 | Mokhlesi | G11C 11/5642 365/185.17 |
| 2013/0250688 A1* | 9/2013 | Chen | G11C 11/5628 365/185.17 |
| 2013/0314995 A1* | 11/2013 | Dutta | G11C 7/1006 365/185.17 |
| 2014/0063985 A1* | 3/2014 | Joo | G11C 16/0483 365/189.011 |
| 2014/0071761 A1* | 3/2014 | Sharon | G11C 16/26 365/185.18 |
| 2014/0247671 A1* | 9/2014 | Ito | G11C 16/26 365/185.23 |
| 2014/0269057 A1* | 9/2014 | Shereshevski | G11C 16/10 365/185.03 |
| 2015/0070986 A1* | 3/2015 | Hirai | G11C 16/3459 365/185.03 |
| 2015/0262678 A1* | 9/2015 | Kim | G11C 16/10 365/185.22 |
| 2015/0279474 A1* | 10/2015 | Shimura | G11C 11/5642 365/185.2 |
| 2015/0287479 A1* | 10/2015 | Nam | G11C 29/025 714/721 |
| 2015/0332773 A1* | 11/2015 | Kwak | G11C 16/10 365/185.11 |

* cited by examiner

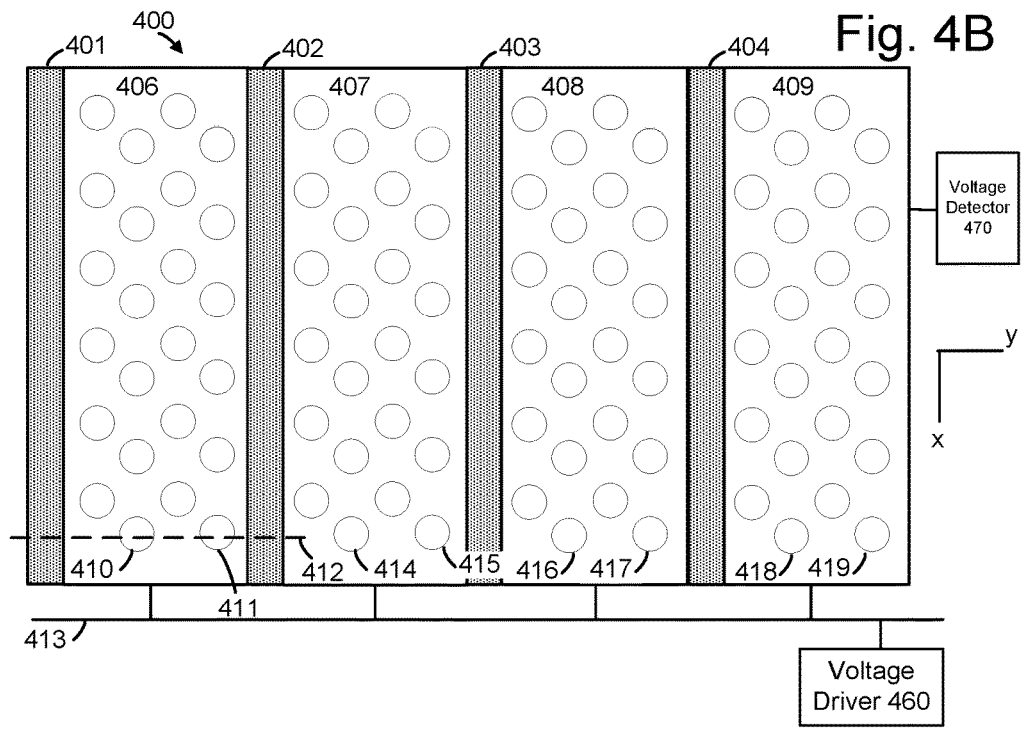
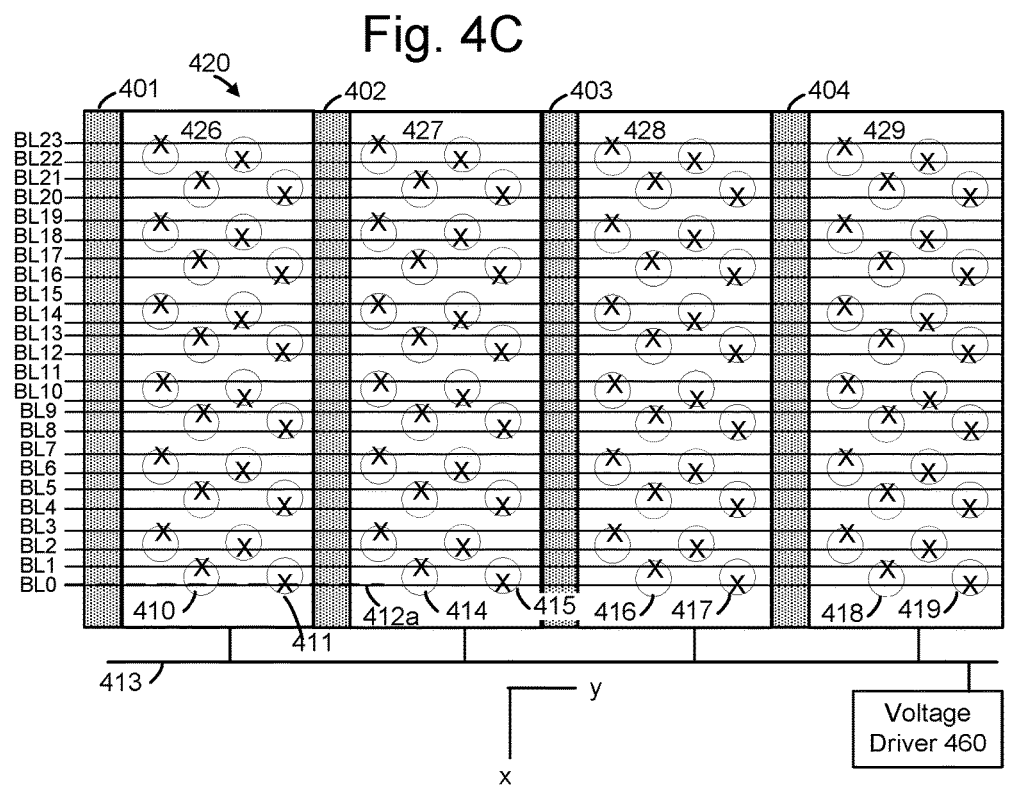

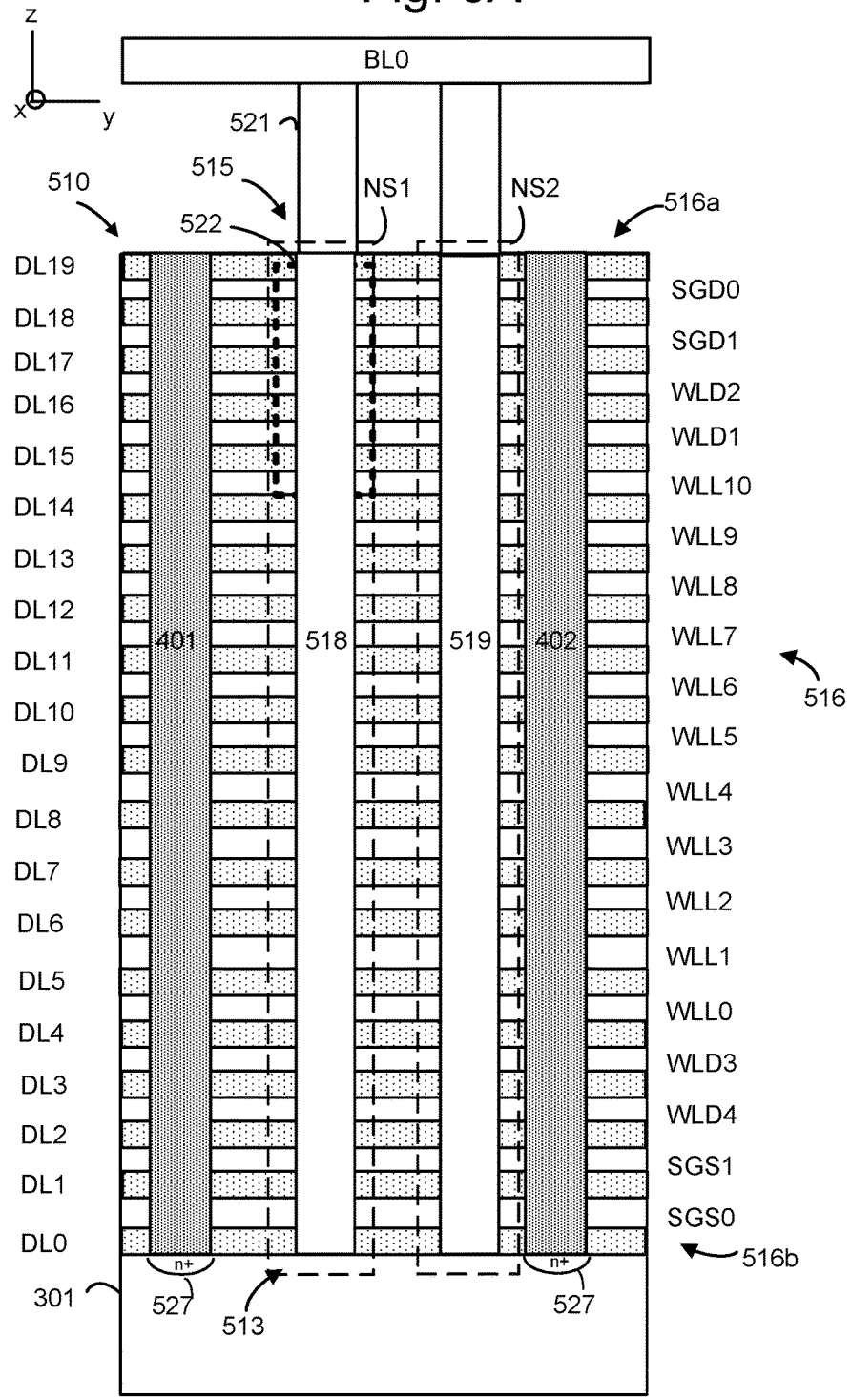

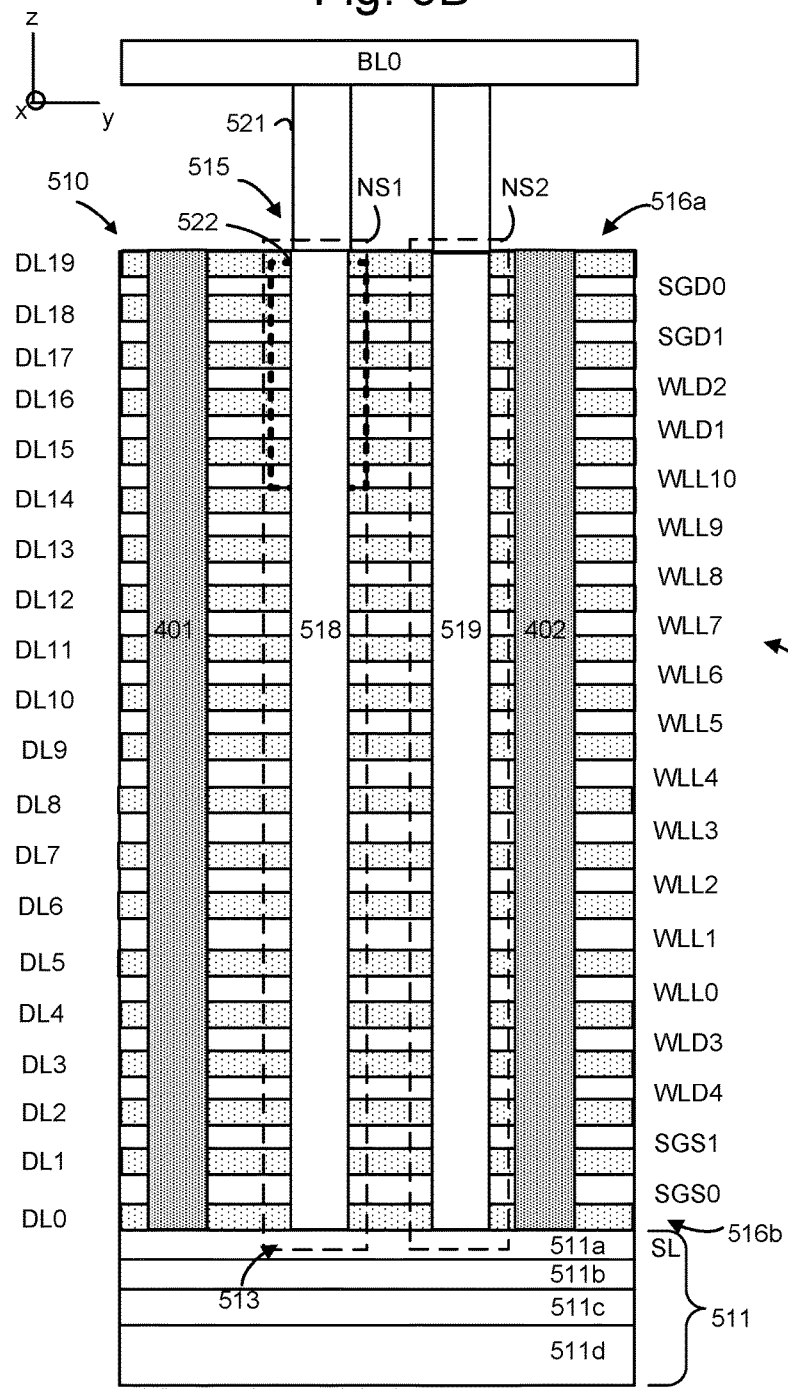
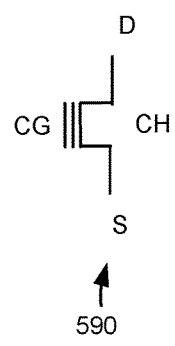
Fig. 5B
Fig. 5C

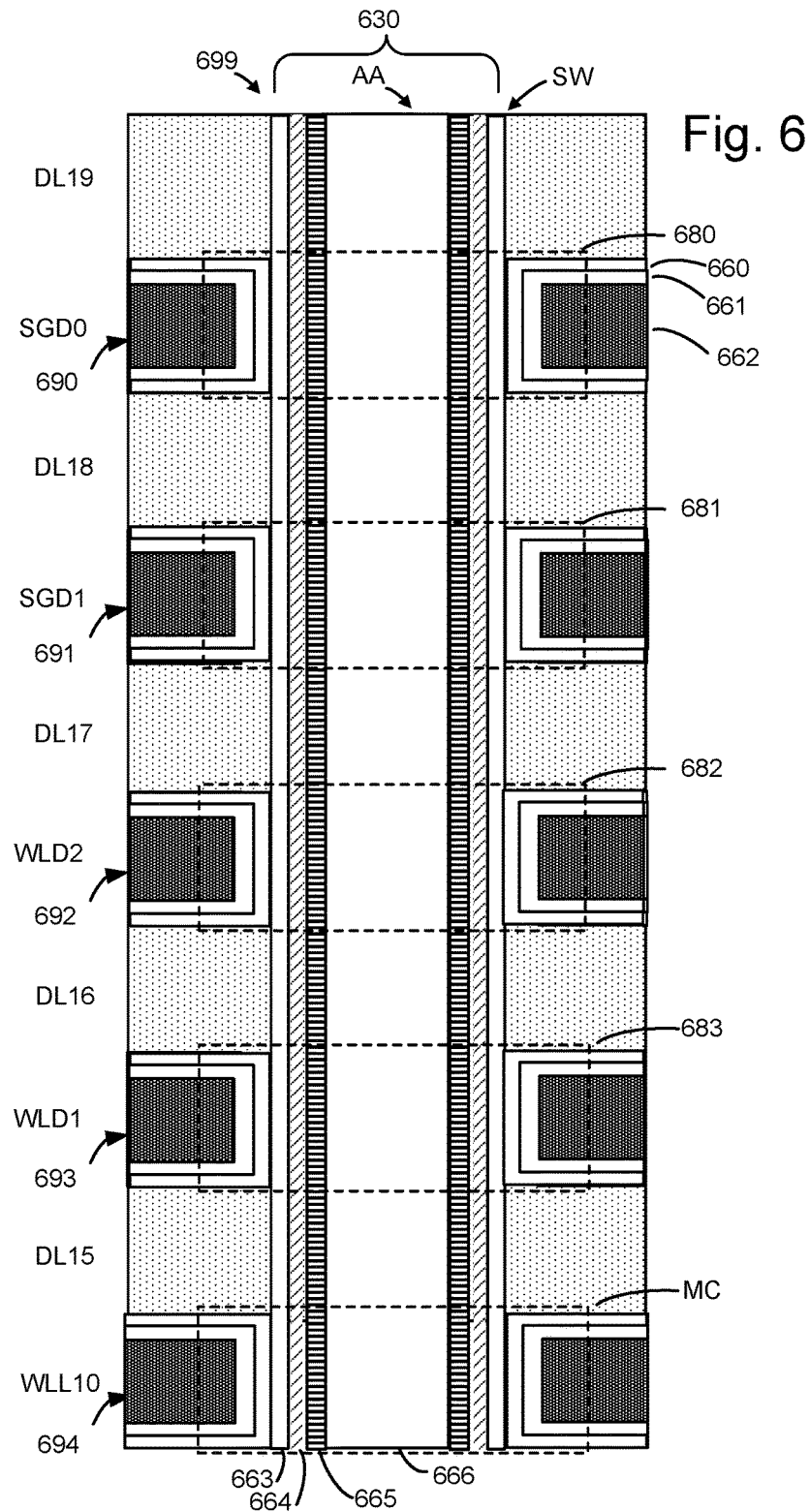

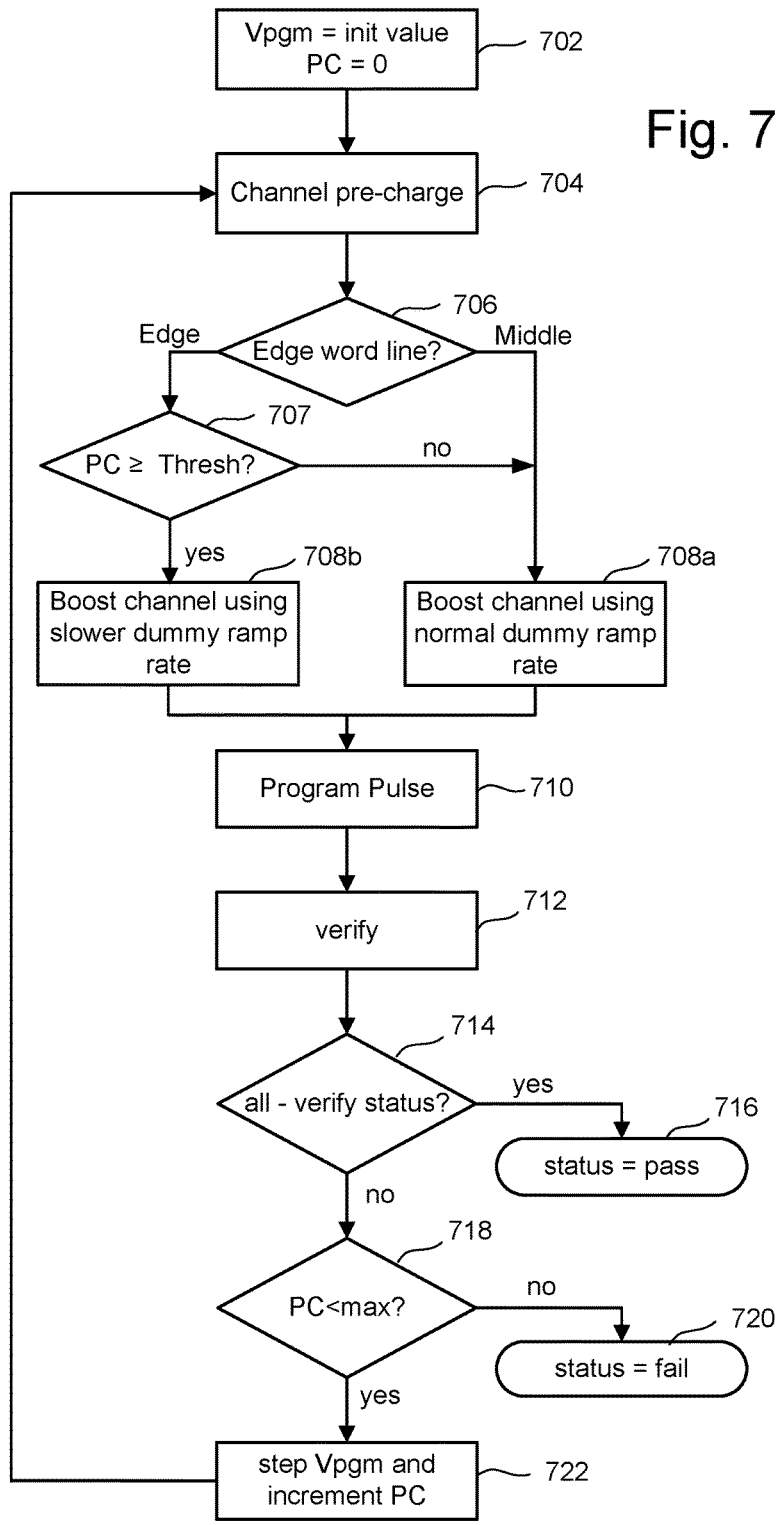

First programming pass

Second programming pass

US 9,887,002 B1

DUMMY WORD LINE BIAS RAMP RATE DURING PROGRAMMING

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a conductive floating gate or a non-conductive charge-trapping material can be used in such memory devices to store a charge which represents a data state. The memory cell may be a transistor in which the charge-storing material may reside between a channel and a control gate. The charge-storing material may be insulated from both the channel and the control gate. The charge-storing material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

In one arrangement, memory cells are arranged in strings having a select gate transistor at each end to selectively connect a channel of the string to a source line at one end and bit line at the other end. The string may have a number of data memory cells and one or more dummy memory cells. If present, a dummy memory cell is typically located between a select gate transistor and the data memory cells. There may be one or more dummy memory cells at each end of the string. The control gates of the memory cells are connected to word lines in some architectures. The word lines that connect to control gates of data memory cells are typically referred to as data word lines. The word lines that connect to control gates of dummy memory cells are typically referred to as dummy word lines. Note that in some architectures the control gates of certain memory cells may share a common "word line." For example, memory cells on neighboring strings may share the same word line.

Memory cells may be programmed by altering the charge in the charge-storing material, thereby altering the threshold voltage of the memory cell transistor. The charge in the charge-storing material may be controlled using Fowler-Nordheim tunneling or hot-electron injection, for example. In one technique, a high voltage is applied to the control gate with a low voltage in the channel to add charge to the charge-storing material.

When programming a memory cell (referred to herein as a "selected memory cell"), memory cells that are not currently selected for programming (referred to herein as "unselected memory cells") may receive some unintentional programming. This unintentional programming is referred to herein as "program disturb." This program disturb may occur to unselected memory cells that share the same word line as the selected memory cell. In order to reduce or eliminate the program disturb, the voltage in the channels of the unselected memory cells may be boosted. Therefore, the voltage differential between the control gate and channel of the unselected memory cell may be low enough to reduce or eliminate unintentional programming of the unselected memory cells. However, challenges remain in preventing or reducing program disturb.

BRIEF DESCRIPTION OF THE DRAWINGS

FIG. 4B depicts a top view of an example word line layer.

FIG. 4C depicts a top view of an example SGD layer.

FIG. 5A depicts an example cross-sectional view of a portion of one of the blocks of FIG. 3.

FIG. 5B depicts an alternative to the embodiment of FIG. 5A.

FIG. 5C depicts an example transistor.

FIG. 6 depicts a close-up view of the region 522 of the stack of FIG. 5A.

FIG. 7 is a flowchart describing one embodiment of a programming process.

DETAILED DESCRIPTION

Apparatuses and techniques are described for programming non-volatile storage. Apparatuses and techniques are described for reducing or eliminating program disturb in non-volatile storage. In one embodiment, the ramp rate of a voltage applied to a dummy word line is reduced during programming of edge word lines. In one embodiment, a slower than normal ramp rate is used when the word line selected for programming is an edge word line, but a normal ramp rate is used when the word line selected for programming is a middle word line.

One technique for preventing or reducing program disturb is to boost the channel potential of strings of memory cells that are inhibited (or unselected) from programming. One technique for boosting the channel of an inhibited string is to apply boosting voltages to unselected word lines, while the programming voltage is applied to the selected word line. Also, the select gate transistors may be cut off to allow the channel of the inhibited string to float. Therefore, the voltage of the channel of the inhibited string may be increased due to capacitive coupling between the control gates of unselected memory cells and the channel of the inhibited string.

In some memory devices, memory cells are joined to one another in a string, such as a NAND string. Each NAND string comprises a number of non-volatile storage elements (also referred to herein as non-volatile memory cells) connected in series between one or more drain-side select transistors (SGD transistors) on a drain-side of the NAND string, and one or more source-side select transistors (SGS transistors) on a source-side of the NAND string. Each NAND string has a channel between the drain side and the source side. Each drain-side select transistor is configured to connect/disconnect a NAND string channel to/from a bit line. Each source-side select transistor is configured to connect/disconnect a NAND string channel to/from a source line.

Figure 1A:
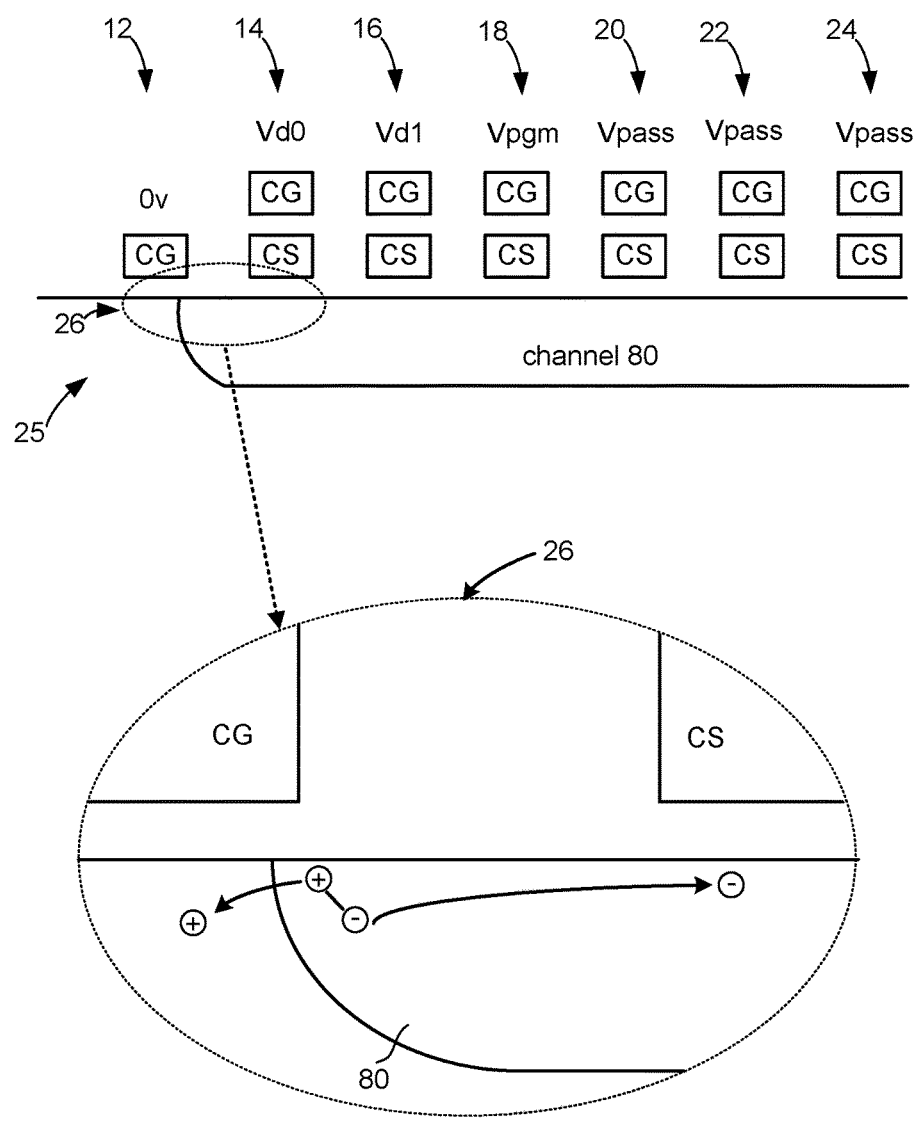
FIG. 1A depicts one end of a string of memory cells to illustrate how voltages might be applied during programming.

FIG. 1A depicts one end of a string 25 of memory cells to illustrate how voltages might be applied during programming. The string 25 may be a portion of a NAND string. A select gate transistor 12, two dummy memory cells 14, 16, and four data memory cells 18, 20, 22, 24 are depicted. The dummy memory cells and data memory cells may also be referred to as dummy memory cell transistors, and dummy memory cell transistors, respectively. Each of the dummy memory cells 14, 16, and the four data memory cells 18, 20, 22, 24 have a charge storage region (CS) and a control gate (CG). The charge storage regions may be, for example, dielectric charge trapping regions or conductive floating gates. The select gate transistor 12 has a control gate (CG), but does not have a charge storage region (CS), in this example. Depending on the architecture, the select gate transistor 12 could also have a charge storage region (CS), which might be used to establish a target threshold voltage for the select gate transistor 12. The select gate could be either on the drain side or the source side. Thus, the select gate transistor 12 may connect/disconnect the string to a bit line or a source line, in one embodiment. A string channel region 80 is depicted below the charge storage regions (CS) of the memory cells. Note that there may be a tunnel dielectric between the charge storage regions (CS) and channel 80. Also, there may be a blocking dielectric between the charge storage regions (CS) and control gates (CG).

For the sake of discussion, the string 25 has voltages applied to inhibit programming of memory cells on the string. However, each control gate may be connected to a word line that is connected to other strings (the word lines and other strings are not depicted in FIG. 1). For example, memory cell 18 may be connected to the selected word line. Thus, even though memory cell 18 is not to be programmed, its control gate receives the programming voltage Vpgm. In order to prevent, or at least reduce, program disturb of memory cell 18, the string's channel may be boosted. To do so, the boosting voltage (Vpass) is applied to the control gates of memory cells 20, 22, 24 (as well as other unselected memory cells on string 25, which are not depicted in FIG. 1A). The boosting voltage is typically less than the programming voltage. It is not required that the boosting voltage applied to the different unselected memory cells have the same magnitude.

The voltages applied to dummy memory cells 14 and 16 are less than Vpass but greater than 0V, in one embodiment. Also, the voltage applied to dummy memory cell 16 may be greater than the voltage applied to dummy memory cell 14. This provides for a gradual increase in the voltage from the select gate transistor 12 to the data memory cells.

However, it is possible for various conditions during programming to result in program disturb. One possible mechanism that may cause program disturb is gate induced drain leakage (GIDL). GIDL may occur at higher drain biases in an off state transistor. The select gate transistor 12 may be off and have a high drain bias as a result of the 0V applied to its control gate and the higher voltages applied to the control gates of the memory cells (which may couple up the voltage of the channel 80). Hence, GIDL may result in the select gate transistor 12. GIDL may result in electron-hole pair generation. One possible reason for program disturb is due to the electron-hole pair generation. The close up region 26 illustrates electron-hole generation near the select gate transistor 12.

The presence of the dummy memory cells 14, 16 may reduce program disturb in the data memory cells 18-24. In part, this may be due to the increased distance between the select gate transistor 12 and the data memory cells. However, there still can be program disturb of the data memory cells, even with the dummy memory cells 14, 16. Note that program disturb of the data memory cells may be more severe when the selected word line is an "edge word line." Herein, an "edge word line" is defined as one of a small group of data word lines that are closest to a select gate line (a select gate line is a conductive line that connects control gates of select gate transistors of different strings) at the end of a string of memory cells. Since the dummy memory cell (or cells) reside between the select gate and the data memory cells, one of the (one or more) edge word lines is immediately adjacent to a dummy word line. There may be one or more edge word lines at either end of the string (the other end of the string 25 is not depicted in FIG. 1A). The number of edge word lines may vary with the architecture. For example, factors such as the width of word lines and spacing between word lines may impact how many word lines are considered to be edge word lines. As one example, there are four edge word lines at each end of the string. However, there may be more of fewer than four edge word lines at each end of the string. All word lines that are between the edge word lines are defined herein as "middle word lines." There is a group of multiple middle word lines between the edge word lines at either end of the string. The number of middle word lines will vary according to the architecture.

A possible reason for the increased program disturb when the selected word line is an edge word line is that a high programming voltage is being applied to the control gate of a memory cell that is physically close to the select gate 12. As noted, the programming voltage (Vpgm) is typically higher than the boosting voltage (Vpass). The voltages on the control gates may impact the channel potential by way of capacitive coupling. Thus, the voltage in the channel may be a function of the voltage on the adjacent control gate. Thus, the select gate transistor 12 may experience more GIDL when the selected word line is an edge word line. Hence, there may be more electron-hole generation when the selected word line is an edge word line.

The inventors have discovered that the rate at which the voltage is increased on the dummy word lines may play an important role in program disturb. In some embodiments, a slower than normal ramp rate is used on the dummy word lines during programming when the selected word line is an edge word line. A slower ramp rate may result in less electron-hole generation, wherein program disturb may be improved.

However, if the slower than normal ramp rate were to be used when programming all word lines, the overall time to program all of the memory cells on the string could be slowed. Hence, when programming other than an edge word line, a normal ramp rate is used on the dummy word lines, in one embodiment. Therefore, a fast overall programming time is achieved.

Figure 1B:
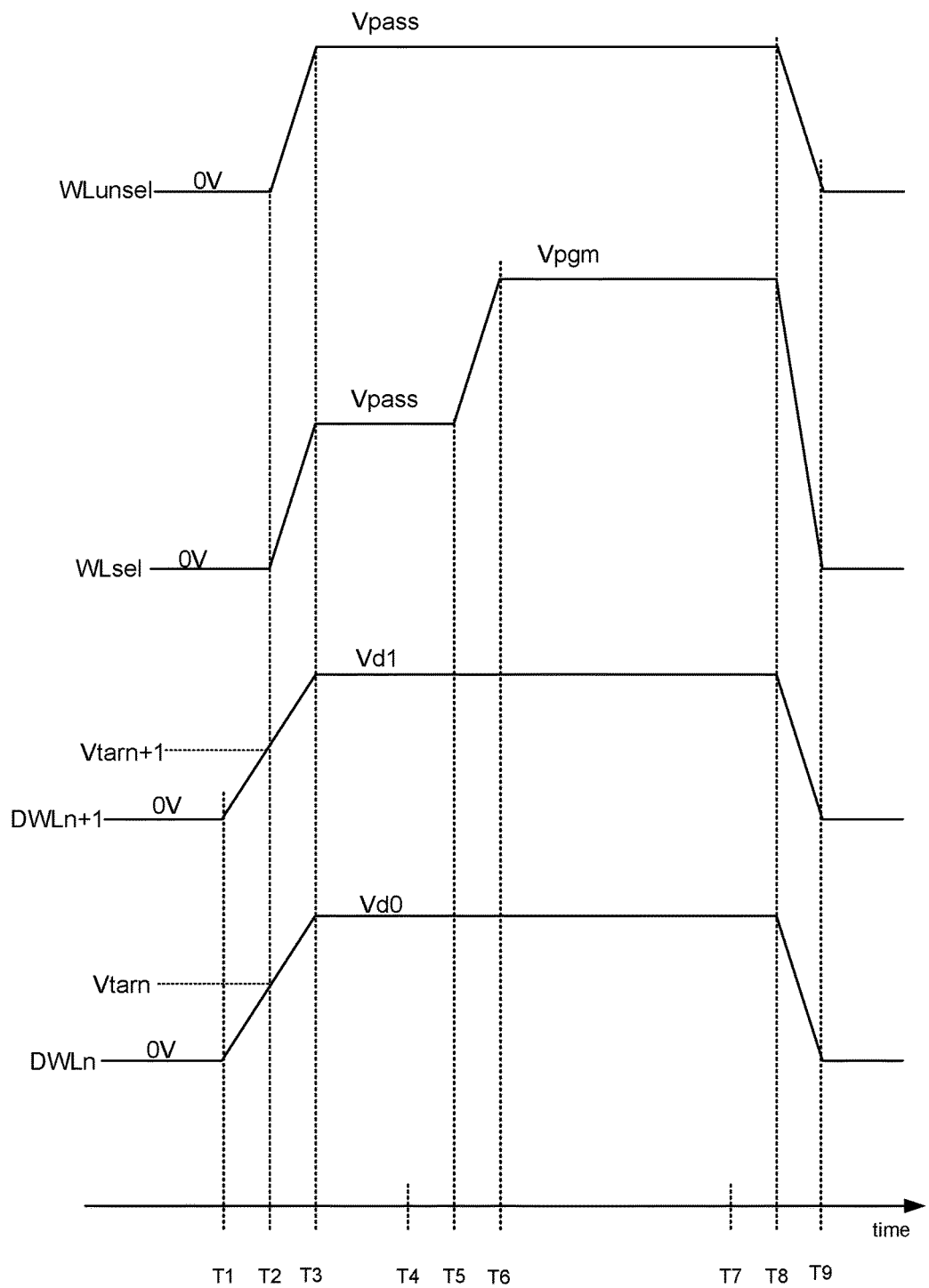
FIG. 1B is a timing diagram of voltages on various word lines during one embodiment of programming non-volatile storage elements.

FIG. 1B is a timing diagram of voltages on various word lines during one embodiment of programming non-volatile storage elements. The timing diagram depicts voltages on two dummy word lines (DWLn, DWLn+1), a selected data word line (WLsel) and an unselected data word line (WLunsel). In this example, the selected word line is an edge word line, wherein the voltages applied to the dummy word line is ramped at a slower than normal rate. The timing diagram may be applied to the string 25 of FIG. 1A, but is not limited to that example. For example, dummy memory cell 14 may have its control gate connected to DWLn, dummy memory cell 16 may have its control gate connected to DWLn+1, data memory cell 18 may have its word line connected to WLsel, and data memory cell 20 may have its control gate connected to WLunsel. Note that the timing of WLsel may be the same for all unselected data word lines. Also note that the dummy word lines could be at either the source end or the drain end of the string 25.

In this example, the voltage on the dummy word lines is ramped at what is referred to herein as a "slower than normal rate." The "rate" at which a voltages increases is defined based on the time it takes to change from a starting voltage to a target voltage. The rate is defined herein as the voltage change (from the starting voltage to the target voltage) divided by the time interval to reach a target voltage. The rate for the voltage on DWLn is thus defined as Vd0/(T3−T1). The rate for the voltage on DWLn+1 is this defined as Vd1/(T3−T1). Note that the slope of the voltage curve is not necessarily flat as depicted in FIG. 1B. For example, the slope could be greater initially, and then level off.

At time T1, the voltage begins to ramp up on the two dummy word lines (DWLn, DWLn+1). At time T2, the voltage begins to ramp up on both the selected word line (WLsel) and the unselected word lines (WLunsel). Thus, note that there is a delay between the start of the ramp between the dummy and data word lines, in this embodiment.

By time T3, the voltage on the dummy word lines has reached its target voltage. The voltage on dummy word line DWLn has reached Vd0; the voltage on dummy word line DWLn+1 has reached Vd1. Note that Vd0 and Vd1 may have different magnitudes. In one embodiment, the voltage on the dummy word line that is closer to the select gate line is lower than the dummy word line that is farther from the select gate line. At time T3, the voltage on the unselected data word lines has reached the intended target of the boosting voltage Vpass. In this embodiment, the selected word line is ramped up to the boosting voltage between time T2 and T3, along with the unselected data word lines. Note that the timing diagram is somewhat idealized and that the voltages may not reach their respective targets at the exact points in time that are depicted. For example, although the timing diagram depicts all the word lines as reaching their targets at time T3, the voltages might not reach the targets at the same time.

Note that the slope of the voltage on the unselected word lines between T2 and T3 may be due in part to the electronic circuitry that provides the voltage to the unselected word line not being able to provide a voltage with an infinite slope. However, another reason for the slope is that there may be some capacitive coupling between the unselected word lines and adjacent conductors that may slow that rate at which the voltage on the unselected word line charges up. It will also be understood that the slope could be different in different locations along the word lines.

Between times T5 and T6, the voltage on the selected word line (WLsel) is increased from Vpass to the programming voltage (Vpgm). Between times T8 and T9, the voltages on the various word lines are reduced to a steady state voltage (e.g., 0V).

Figure 1C:
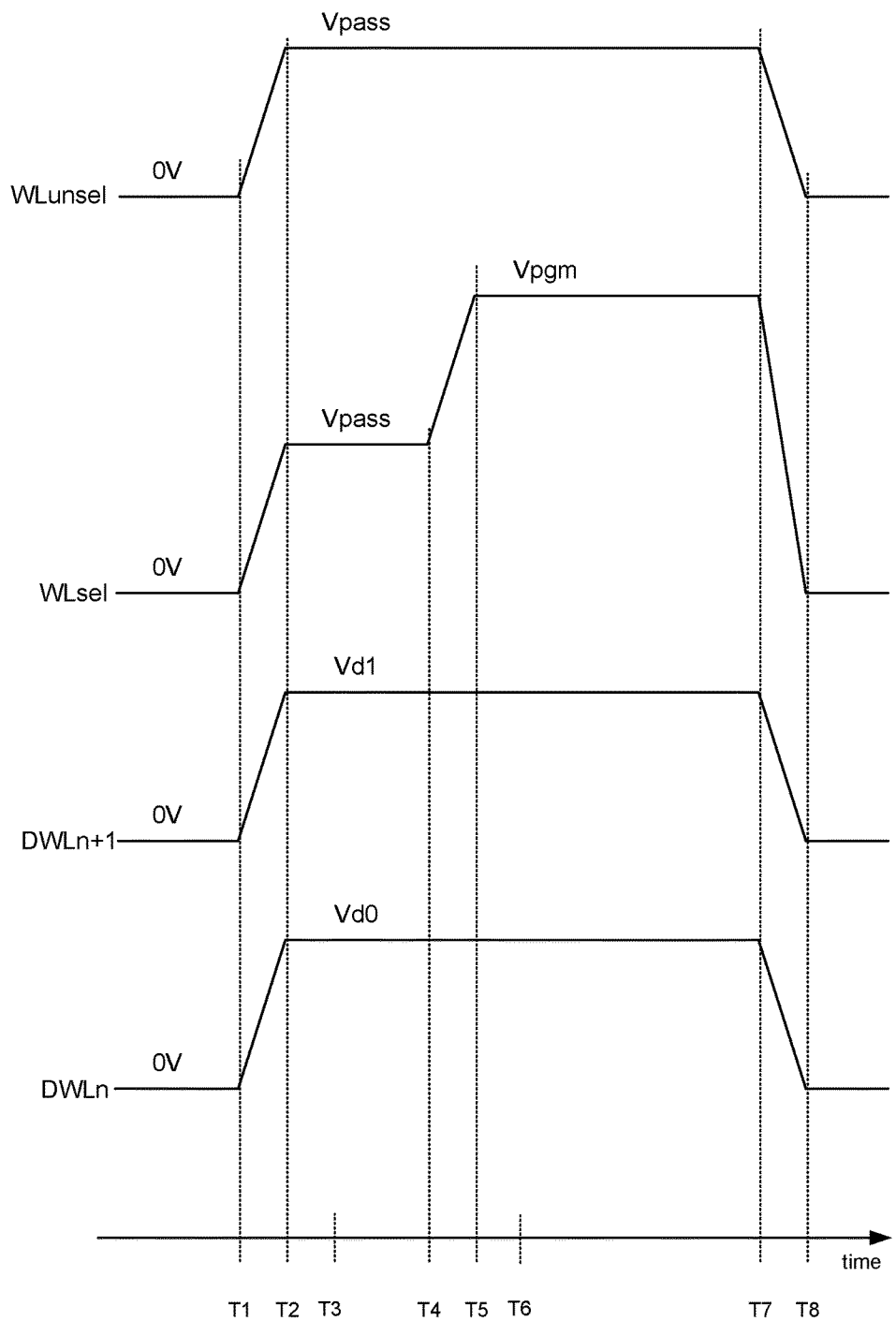
FIG. 1C is a timing diagram of voltages applied to the various word lines of FIG. 1B during one embodiment of programming non-volatile storage elements in which the selected word line is a middle word line.

FIG. 1C is a timing diagram of voltages applied to the various word lines of FIG. 1B during one embodiment of programming non-volatile storage elements in which the selected word line is a middle word line. In this example, the voltage on the dummy word lines is ramped at what is referred to herein as a "normal rate." The timeline uses the same time references as the example of FIG. 1B, for purposes of comparison.

At time T1, the voltage begins to ramp up on the two dummy word lines (DWLn, DWLn+1), as well as on the selected word line and the unselected word lines. Thus, note that there is not a delay between the start of the ramp of the dummy and the ramp of the data word lines, in this embodiment.

By time T2, the voltage on the dummy word lines has reached its target voltage. Also time T3, the voltage on the unselected data word lines has reached the intended target of the boosting voltage Vpass. Furthermore, the voltage on the selected word line has been ramped to Vpass. Note that the timing diagram is somewhat idealized and that the voltages may not reach their respective targets at the exact points that are depicted. For example, although the timing diagram depicts all the word lines as reaching their targets at time T2, the voltages might not reach the targets at the same time. Also note that due to using the normal ramp rate on the dummy word lines (and not delaying the start of applying the voltage to the data word lines), the word line voltages have stabilized earlier than on the example of FIG. 1B.

Between times T4 and T5, the voltage on the selected word line (WLsel) is increased from Vpass to the programming voltage (Vpgm). Note this is earlier relative to the timing of the example of FIG. 1B. Between times T7 and T8, the voltages on the various word lines are reduced to a steady state voltage (e.g., 0V). Note this is earlier relative to the timing of the example of FIG. 1B.

In one embodiment, a normal ramp rate is achieved by applying a "pulse voltage" to one end of the dummy word line. The pulse voltage may be generated by a charge pump or other circuitry and may have a very steep slope. For example, the slope of the pulse voltage that is applied to the dummy word line may be about as steep as possible given the non-ideal factors of real world circuit components, transmission lines, etc. Due to factors such as capacitive coupling between the dummy word line and other word lines (and other conductive elements), the voltage on the dummy word line may ramp up at a rate that is determined at least in part by the capacitive coupling. Thus, note that the ramp rate (or slope) of the voltage on a random location on the dummy word line does not necessarily match that of the pulse voltage applied to one end of the dummy word line.

In one embodiment, a slower than normal ramp rate is achieved by generating a "ramp voltage" with a less steep slope than the "pulse voltage." A charge pump or other circuitry may be used to generate the ramp voltage. The charge pump may be configured to generate a ramp voltage that ramps between 0V and the final voltage at a controlled rate over some time period. The ramp voltage may be applied to one end of the dummy word line. Again, factors such as capacitive coupling between the dummy word line and other word lines may result in the voltage on a random location on the dummy word increasing at a slower rate than the ramp voltage applied to one end of the dummy word line. However, the voltage at some specific physical location on the dummy word line ramps up at a slower rate than when the normal ramp rate is used.

In one embodiment, a control circuit increases a voltage on a dummy word line at some rate by applying a voltage waveform having a certain slope to the dummy word line. For example, to increase the voltage on the dummy word line to a dummy word line voltage at a first rate when the data word line that is selected for programming is an edge word line, a control circuit may be configured to apply a voltage waveform that has a first slope to the dummy word line. To increase a voltage on the dummy word line to the dummy word line voltage at a second rate that is faster than the first rate when the data word line that is selected for programming is a middle word line, the control circuit may be configured to apply a voltage waveform that has a second slope to the dummy word line, wherein the second slope is greater than the first slope.

In some embodiments, the slope of a voltage waveform applied to word lines (data and/or dummy) may be generated using a voltage regulator. The slope of the voltage waveform may be generated using a configurable RC network at the output of the voltage regulator or using a tunable resistor or transistor in series with the voltage regulator. In one example, the tunable resistor may be adjusted or set such that the slope of the output voltage waveform from the voltage regulator matches the slope of the desired voltage waveform. In one embodiment, the voltage waveform may be generated using a voltage regulator in which an internal regulation point within the voltage regulator or a node within the voltage regulator through which closed-loop feedback is used to generate the desired voltage waveform may be adjusted over time using a predetermined waveform schedule (e.g., stored in a non-volatile memory) in order to generate the desired voltage waveform with the desired slope. The output of the voltage regulator may be buffered (e.g., using a unity gain buffer) prior to driving one or more word lines.

Note that in some embodiments, techniques described in the previous paragraph may be used to generate a voltage waveform for the slower than normal ramp rate voltage that is applied to the dummy word lines under some circumstances (e.g., when the selected word line is an edge word line). However, it may not be necessary to use such techniques to generate a voltage waveform for the normal ramp rate voltage that is applied to unselected word lines (and to the dummy word line when the selected word line is other than an edge word line). However, the configurable RC network at the output of the voltage regulator or a tunable resistor or transistor in series with the voltage regulator could also be used to generate a voltage waveform for the normal ramp rate.

Figure 2A:
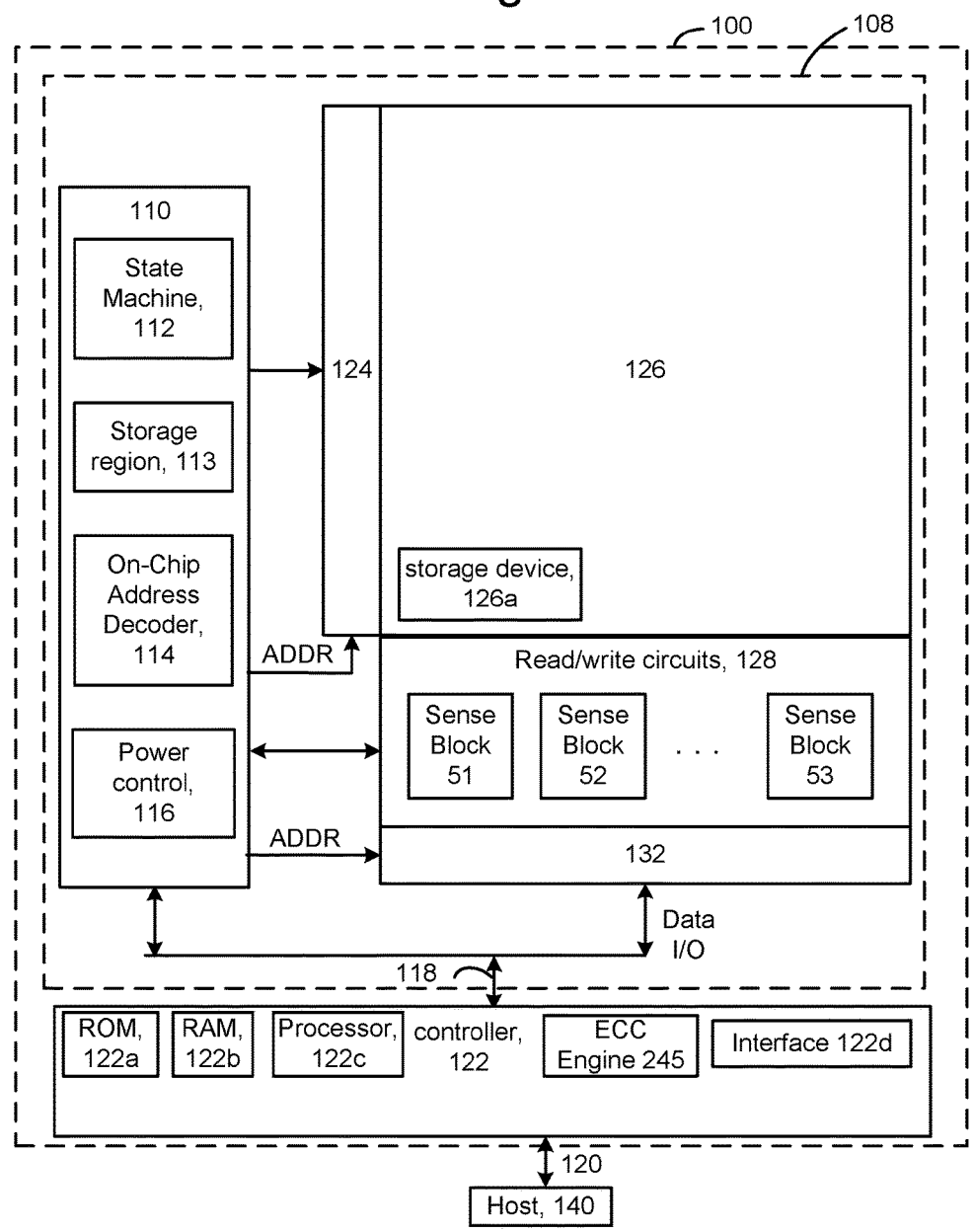
FIG. 2A is a block diagram of an example memory device in which embodiment may be practiced.

FIG. 2A is a block diagram of an example memory device in which embodiment may be practiced. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . , 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114 and a power control module 116. The state machine 112 provides chip-level control of memory operations. A storage region 113 may be provided, e.g., for operational parameters and software/code. In one embodiment, the state machine is programmable by the software. In other embodiments, the state machine does not use software and is completely implemented in hardware (e.g., electrical circuits).

In one embodiment, storage region 113 includes a table of ramp rates for dummy word lines during programming. The table may contain a default set of values for when the selected word line is a middle word line, and a special set of values for when the selected word line is an edge word line. In one embodiment, storage region 113 includes a table that defines a threshold value of the number of program loops before using a slower than normal ramp rate for the dummy word line (when the selected word line is an edge word line).

The on-chip address decoder 114 provides an address interface between that used by the host or a memory controller to the hardware address used by the decoders 124 and 132. The power control module 116 controls the power and voltages supplied to the word lines, select gate lines, bit lines and source lines during memory operations. It can include drivers for word lines, SGS and SGD transistors and source lines. The sense blocks can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 116, sense blocks 51, 52, . . . , 53, read/write circuits 128, controller 122, and so forth. The control circuit may also be referred to as a managing circuit.

The off-chip controller 122 (which in one embodiment is an electrical circuit) may comprise a processor 122c, storage devices (memory) such as ROM 122a and RAM 122b and an error-correction code (ECC) engine 245. The ECC engine can correct a number of read errors.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate). In one embodiment, vertically orientated NAND strings extend perpendicular to the major surface of the substrate.

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 2B:
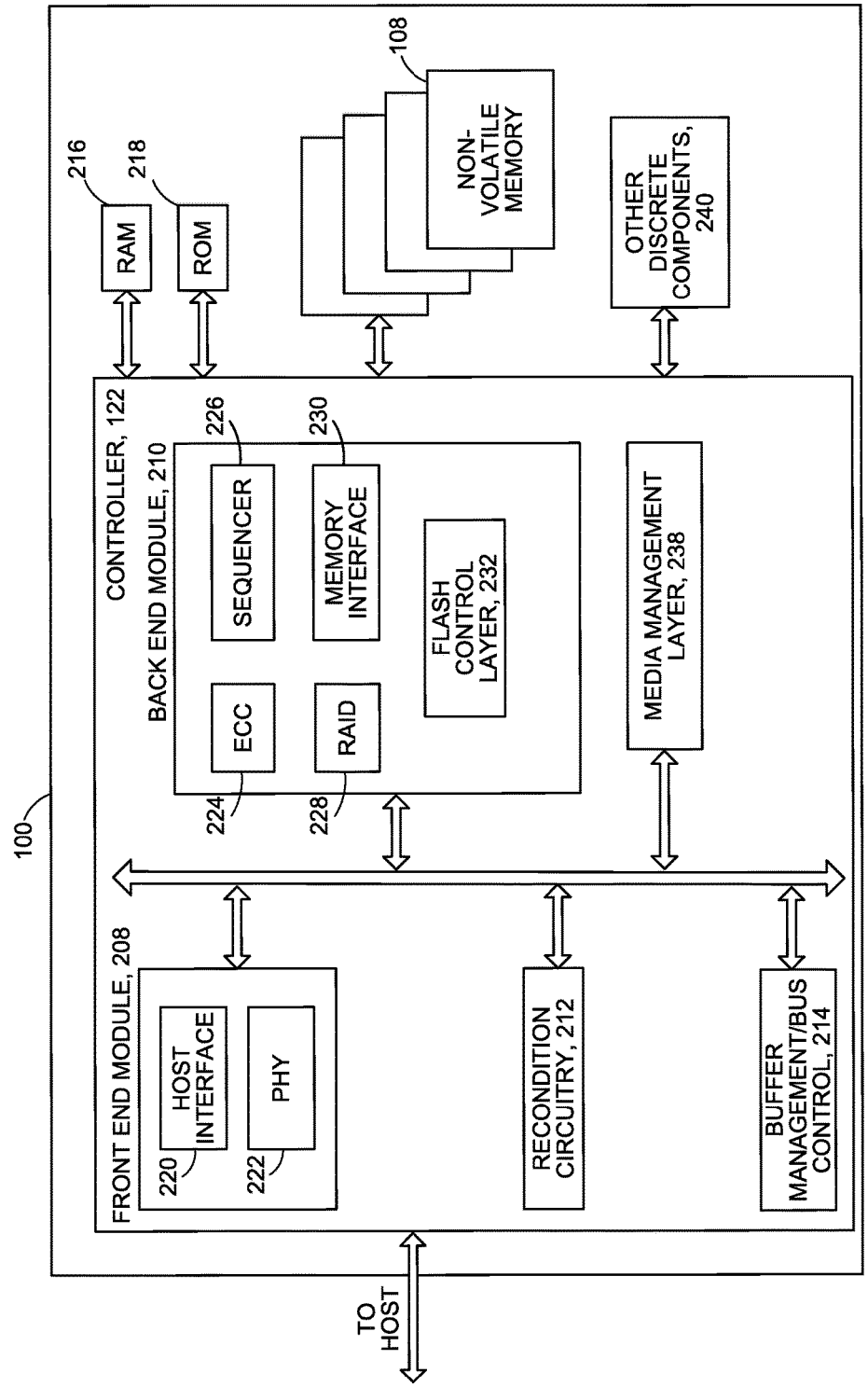
FIG. 2B is a block diagram of the example memory device, depicting additional details of the controller.

FIG. 2B is a block diagram of the example memory device 100, depicting additional details of the controller 122. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between the controller 122 and non-volatile memory die 108 may be any suitable flash interface. In one embodiment, memory device 100 may be a card based system, such as a secure digital (SD) or a micro secure digital (micro-SD) card. In an alternate embodiment, the memory system may be part of an embedded memory system. For example, the flash memory may be embedded within the host, such as in the form of a solid state disk (SSD) drive installed in a personal computer.

In some embodiments, the memory device 100 includes a single channel between the controller 122 and the non-volatile memory die 108, the subject matter described herein is not limited to having a single memory channel.

The controller 122 includes a front end module 208 that interfaces with a host, a back end module 210 that interfaces with the one or more non-volatile memory die 108, and various other modules that perform functions which will now be described in detail.

The components of the controller may take the form of a packaged functional hardware unit (e.g., an electrical circuit) designed for use with other components, a portion of a program code (e.g., software or firmware) executable by a processor, e.g., microprocessor, or processing circuitry that usually performs a particular function of related functions, or a self-contained hardware or software component that interfaces with a larger system, for example. For example, each module may include an Application Specific Integrated Circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for the controller to perform the functions described herein. The architecture depicted in FIG. 2 is one example implementation that may (or may not) use the components of the controller 122 depicted in FIG. 1A (e.g., RAM, ROM, processor, interface).

The controller 122 may include recondition circuitry 212, which is used for reconditioning memory cells or blocks of memory. The reconditioning may include refreshing data in its current location or reprogramming data into a new word line or block as part of performing erratic word line maintenance, as described below.

Referring again to modules of the controller 122, a buffer manager/bus controller 214 manages buffers in random access memory (RAM) 216 and controls the internal bus arbitration of Controller 122. The RAM may include DRAM and/or SRAM. DRAM or Dynamic Random Access Memory is a type of semiconductor memory in which the memory is stored in the form of a charge. Each memory cell in a DRAM is made of a transistor and a capacitor. The data is stored in the capacitor. Capacitors loose charge due to leakage and hence DRAMs are volatile devices. To keep the data in the memory, the device must be regularly refreshed. In contrast, SRAM or Static Random Access Memory will retain a value as long as power is supplied.

A read only memory (ROM) 218 stores system boot code. Although illustrated in FIG. 2B as being located separately from the controller, in other embodiments, one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction controller (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the memory device 100. In some cases, the RAID module 228 may be a part of the ECC engine 224. Note that the RAID parity may be added as an extra die or dies as implied by the common name, but it may also be added within the existing die, e.g. as an extra plane, or extra block, or extra word lines within a block. A memory interface 230 provides the command sequences to non-volatile memory die 108 and receives status information from the non-volatile memory die. A flash control layer 232 controls the overall operation of back end module 210.

Additional components of memory device 100 include media management layer 238, which performs wear leveling of memory cells of non-volatile memory die 108. The memory system also includes other discrete components 240, such as external electrical interfaces, external RAM, resistors, capacitors, or other components that may interface with Controller 122. In alternative embodiments, one or more of the physical layer interface 222, RAID module 228, media management layer 238 and buffer management/bus controller 214 are optional components that are not necessary in the Controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the memory structure 126, e.g., flash memory, of die 108. The MML 238 may be needed because: 1) the flash memory may have limited endurance; 2) the flash memory may only be written in multiples of pages; and/or 3) the flash memory may not be written unless it is erased as a block. The MML 238 understands these potential limitations of the flash memory which may not be visible to the host. Accordingly, the MML 238 attempts to translate the writes from host into writes into the flash memory. Erratic bits may be identified and recorded using the MML 238. This recording of erratic bits can be used for evaluating the health of blocks and/or word lines (the memory cells on the word lines).

The controller 122 may interface with one or more memory dies 108. In in one embodiment, the controller and multiple memory dies (together comprising the memory device 100) implement a solid state drive (SSD), which can emulate, replace or be used instead of a hard disk drive inside a host, as a network-attached storage (NAS) device, and so forth. Additionally, the SSD need not be made to work as a hard drive.

Figure 3:
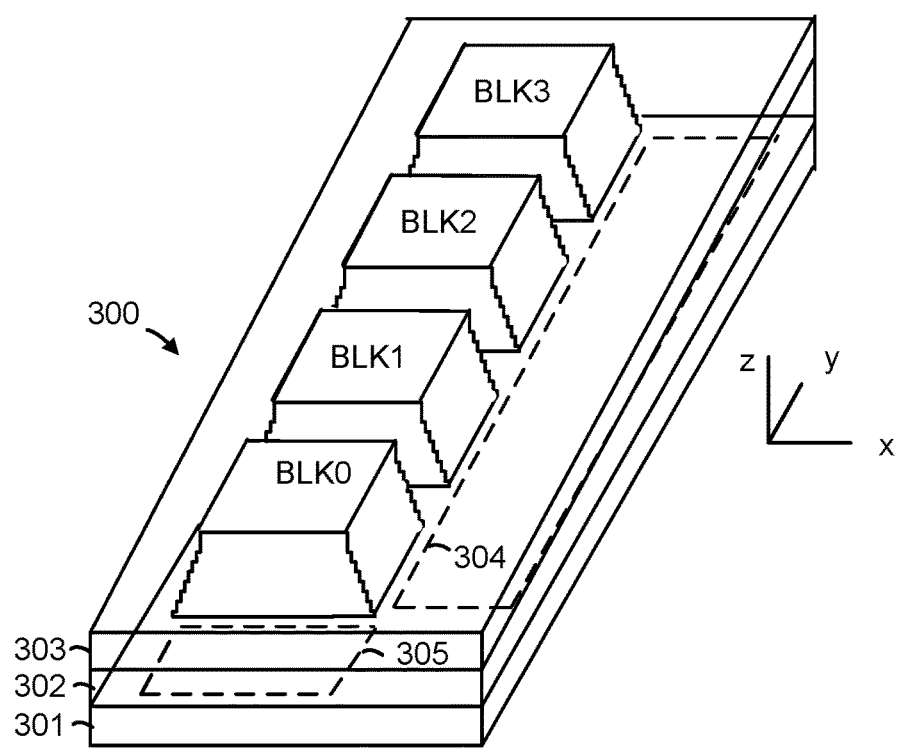
FIG. 3 is a perspective view of a memory device comprising a set of blocks in an example 3D configuration of the memory structure of FIG. 2A.

FIG. 3 is a perspective view of a memory device 300 comprising a set of blocks in an example 3D configuration of the memory structure 126 of FIG. 2A. On the substrate are example blocks BLK0, BLK1, BLK2 and BLK3 of memory cells (storage elements) and peripheral areas with circuitry for use by the blocks. The substrate has a major surface that extends in the x-y plane. The blocks may be formed over the major surface. The peripheral area 304 runs along an edge of each block while the peripheral area 305 is at an end of the set of blocks. Each peripheral area can include circuitry, including but not limited to voltage drivers which can be connected to control gate layers, bit lines and source lines of the blocks.

The substrate 301 can also carry circuitry under the blocks, along with one or more lower metal layers which are patterned in conductive paths to carry signals of the circuitry. The blocks are formed in an intermediate region 302 of the memory device. In an upper region 303 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 4A:
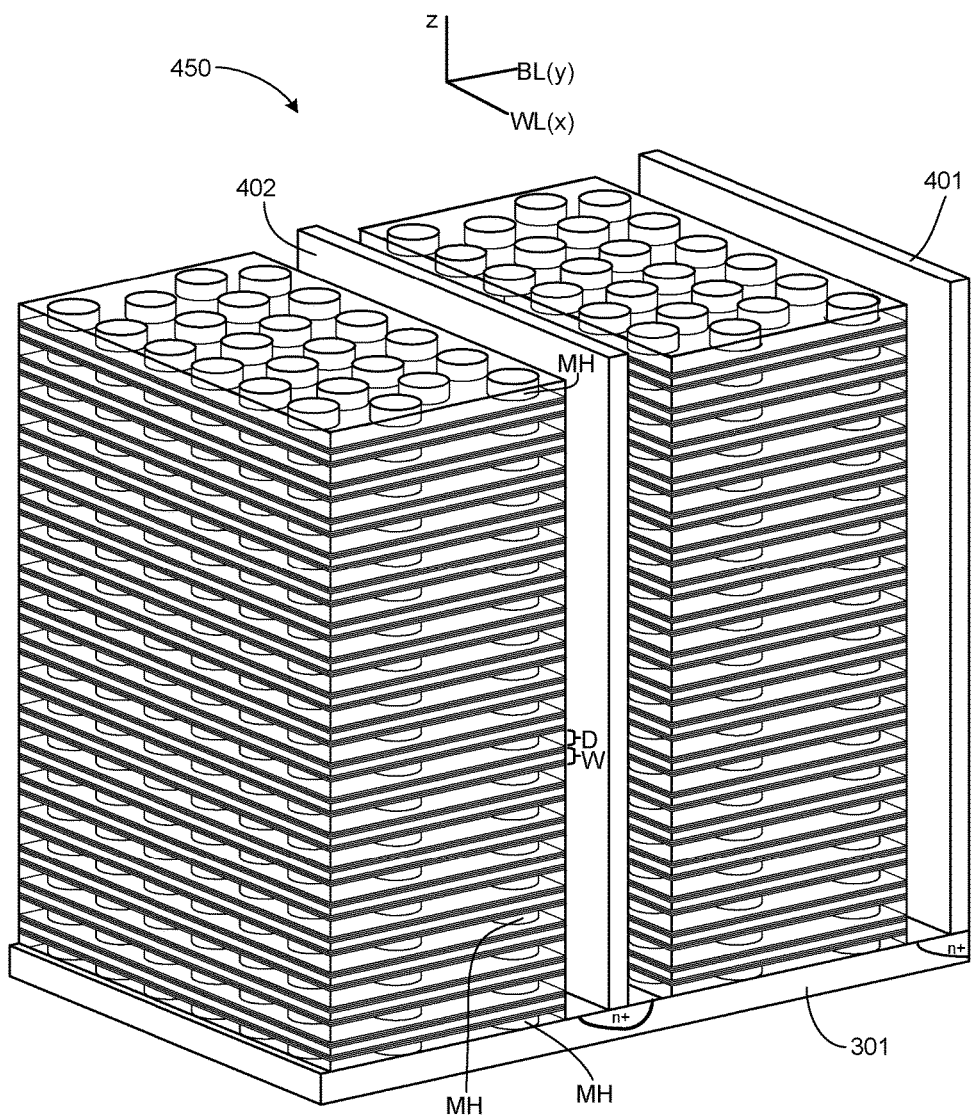
FIG. 4A is a perspective view of a portion of a three dimensional monolithic memory structure, which includes a plurality memory cells.

FIG. 4A is a perspective view of a portion of a three dimensional monolithic memory structure 450, which includes a plurality memory cells. For example, FIG. 4A shows a portion of one block of memory. For example purposes, one of the dielectric layers is marked as D and one of the conductive layers (also called word line layers) is marked as W. The number of alternating dielectric layers and conductive layers can vary based on specific implementation requirements. One set of embodiments includes between 108-216 alternating dielectric layers and conductive layers, for example, 96 data word line layers, 8 select layers, 4 dummy word line layers and 108 dielectric layers. More or fewer than 108-216 layers can also be used. The alternating dielectric layers and conductive layers are divided into "fingers" by local source lines 401, 402. Note that the local source lines 401, 402 may also be referred to as local interconnects LI. FIG. 4A only shows two fingers and two local interconnects LI. An example is depicted in FIGS. 4B and 4C with additional fingers and LI. The local source lines 401, 402 are conductive elements. Below and the alternating dielectric layers and word line layers is a substrate 301. Each local source line 401, 402 is in electrical contact with an n+ diffusion region of the substrate 301, in one embodiment. Note that the local source lines 444 each have a major plane that extends in the x-z plane.

Memory holes are formed in the stack of alternating dielectric layers and conductive layers. For example, one of the memory holes is marked as MH. Note that in FIG. 4A, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data.

FIG. 4B depicts a top view of an example word line layer 400. This could be a dummy word line layer or a data word line layer. A word line layer in each block can be divided into regions. Each region can extend between slits which are formed periodically in the stack to process the word line layers during the fabrication process of the memory device. This processing can include replacing a sacrificial material of the word line layers with metal. Generally, the distance between slits should be relatively small to account for a limit in the distance that an etchant can travel laterally to remove the sacrificial material, and that the metal can travel to fill a void which is created by the removal of the sacrificial material. For example, the distance between slits may allow for a few rows of memory holes between adjacent slits. The layout of the memory holes and slits should also account for a limit in the number of bit lines which can extend across the region while each bit line is connected to a different memory cell. After processing the word line layers, the slits can optionally be filed with metal to provide an interconnect through the stack.

In the example of FIG. 4B, there are four rows of memory holes between adjacent slits. A row here is a group of memory holes which are aligned in the x-direction. Moreover, the rows of memory holes are in a staggered pattern to increase the density of the memory holes. The word line layer is divided into regions 406, 407, 408 and 409 which are each connected by a conductive connector 413. The connector 413 may be connected to a voltage driver 460 for the word line layer. The voltage driver 460 may be configured to provide voltages to the word lines during programming. For example, the voltage driver 460 may be configured to provide a bias voltage to a dummy word line during programming. In one embodiment, the voltage driver 460 is provided a voltage by a charge pump (not depicted in FIG. 4B). A voltage detector 470 is also depicted connected to region 409. The voltage detector is able to detect the voltage on the word line. The location of voltage detector 470 is representative. The voltage detector 470 can connect to the word line at any point.

The region 406 has example memory holes 410 and 411 along a line 412. The region 407 has example memory holes 414 and 415. The region 408 has example memory holes 416 and 417. The region 409 has example memory holes 418 and 419. Each circle represents the cross-section of a memory hole at a word line layer or select gate layer. Each circle can alternatively represent a memory cell which is provided by the materials in the memory hole and by the adjacent word line layer.

Metal-filled slits 401, 402, 403 and 404 (e.g., metal interconnects) may be located between and adjacent to the edges of the regions 406-409. The metal-filled slits provide a conductive path from the bottom of the stack to the top of the stack. For example, a source line at the bottom of the stack may be connected to a conductive line above the stack, where the conductive line is connected to a voltage driver in a peripheral region of the memory device.

The structure of FIG. 4C depicts a top view of an example SGD layer 420. The SGD layer is divided into regions 426, 427, 428 and 429. Each region can be connected to a respective voltage driver 460. This allows a set of memory cells in one region of a word line layer to be programmed concurrently, with each memory cell being in a respective NAND string which is connected to a respective bit line. A voltage can be set on each bit line to allow or inhibit programming during each program voltage.

The region 426 has the example memory holes 410 and 411 along a line 412a which is coincident with a bit line BL0. The region 427 also has the example memory hole 414 which is coincident with a bit line BL1. A number of bit lines extend above the memory holes and are connected to the memory holes as indicated by the "X" symbols. BL0 is connected to a set of memory holes which includes the memory holes 411, 415, 417 and 419. Another example bit line BL1 is connected to a set of memory holes which includes the memory holes 410, 414, 416 and 418. The metal-filled slits 401, 402, 403 and 404 from FIG. 4B are also depicted, as they extend vertically through the stack. The bit lines can be numbered in a sequence BL0-BL23 across the SGD layer 420 in the −x direction.

Different subsets of bit lines are connected to cells in different rows. For example, BL0, BL4, BL8, BL12, BL16 and BL20 are connected to cells in a first row of cells at the right hand edge of each region. BL2, BL6, BL10, BL14, BL18 and BL22 are connected to cells in an adjacent row of cells, adjacent to the first row at the right hand edge. BL3, BL7, BL11, BL15, BL19 and BL23 are connected to cells in a first row of cells at the left hand edge of each region. BL1, BL5, BL9, BL13, BL17 and BL21 are connected to cells in an adjacent row of cells, adjacent to the first row at the left hand edge.

FIG. 5A depicts an example cross-sectional view of a portion of one of the blocks of FIG. 3. The structure is a cross section along line 412 of one embodiment of the structures of FIGS. 4B and 4C. The block comprises a stack 510 of alternating conductive and dielectric layers. In this example, the conductive layers comprise two SGD layers (SGD0, SGD1), two SGS layers (SGS0, SGS1) and four dummy word line layers (or word lines) WLD1, WLD2, WLD3 and WLD4, in addition to data word line layers (or word lines) WLL0-WLL10. The dielectric layers are labelled as DL0-DL19. Further, regions of the stack which comprise NAND strings NS1 and NS2 are depicted. Each NAND string encompasses a memory hole 518 or 519 which is filled with materials which form memory cells adjacent to the word lines. A region 522 of the stack is shown in greater detail in FIG. 6. Note that there may be more or fewer SGD layers, SGS layers, dummy word line layers, and data word line layers.

In the stack 510, at least word line layer WLL0 at the source end and WLL10 at the drain end are defined as edge word line layers (which contain edge word lines). Word line WLL1, which is immediately adjacent to WLL0, may also be considered to be an edge word line layer (having an edge word line). However, WLL1 is not required to be considered to be an edge word line layer. If WLL1 is considered to be an edge word line layer, then WLL2 might or might not also be considered to be an edge word line layer. Likewise, word line WLL9, which is immediately adjacent to WLL10, may also be considered to be an edge word line layer. However, WLL9 is not required to be considered to be an edge word line layer. If WLL9 is considered to be an edge word line layer, then WLL8 might or might not also be considered to be an edge word line layer. There are a number of data word line layers that are not considered to be edge word line layers. For example, if the edge word line layers are defined as WLL0, WLL1, WLL9, and WLL10, then all word line layers between (WLL3-WLL8) are not edge word line layers.

All data word line layers that are between edge word line layers are defined herein as "middle word line layers" (which comprise middle word lines). For example, if the edge word lines layers are WLL0, WLL1, WLL9, and WLL10, then the middle word line layers are defined as WLL2-WLL8. In some cases, there are many more data word line layers than depicted in FIG. 5A. Hence, there could be many more middle word line layers. It is also possible for there to be fewer middle word line layers.

NS1 has a source-end 513 at a bottom 516b of the stack 516 and a drain-end 515 at a top 516a of the stack. Metal-filled slits 401 and 402 may be provided periodically across the stack as interconnects which extend through the stack, such as to connect to a line above the stack. The slits may be used during the formation of the word lines and subsequently filled with metal. A portion of a bit line BL0 is also depicted. A conductive via 521 connects the drain-end 515 to BL0.

The stack is formed over a substrate 301. In one approach, the substrate has n+ regions 527 at the base of the metal-filled slits 401 and 402. The two SGS layers may comprise select gate transistors, which may be used to connect/disconnect the source-end 513 to/from the metal-filled slits 401 and 402. Thus, the source end of the NAND strings may be connected/disconnected to/from a source line.

In one approach, the block of memory cells comprises a stack of alternating control gate and dielectric layers, and the memory cells are arranged in vertically extending memory holes in the stack. In one approach, each block comprises a terraced edge in which vertical interconnects connect to each layer, including the SGS, WL and SGD layers, and extend upward to horizontal paths to voltage sources.

FIG. 5B depicts an alternative to the embodiment of FIG. 5A. In this example, a source line 511 is formed at the bottom of the stack 510. In one approach, a portion of the source line SL comprises an n-type source diffusion layer 511a in the substrate which is in contact with a source end 513 of each string of memory cells in a block. The n-type source diffusion layer 511a is formed in a p-type well region 511b, which in turn is formed in an n-type well region 511c, which in turn is formed in a p-type semiconductor substrate 511d, in one embodiment. The n-type source diffusion layer 511a may be shared by all of the blocks in a plane, in one approach.

FIG. 5C depicts an example transistor 590. The transistor comprises a control gate CG, a drain D, a source S and a channel CH. The control gate may also be referred to as a control terminal. The drain and source may also be referred to as terminals of the transistor. Note that which physical terminals of the transistor functions as the source and drain may depend on the voltages that are applied to the transistor. The transistor may be a select gate transistor or a memory cell transistor. In the case that the transistor is a select gate transistor, the drain may be biased to a significantly higher voltage than the control gate during a portion of a programming procedure, which may result in GIDL.

FIG. 6 depicts a close-up view of the region 522 of the stack of FIG. 5A. Memory cells are formed at the different levels of the stack at the intersection of a word line layer and a memory hole. In this example, SGD transistors 680 and 681 are provided above dummy memory cells 682 and 683 and a data memory cell MC. The data memory cell is one example of an edge data memory cell (which is connected to an edge word line). A number of layers can be deposited along the sidewall (SW) of the memory hole 630 and/or within each word line layer, e.g., using atomic layer deposition. For example, each pillar 699 or column which is formed by the materials within a memory hole can include a charge-trapping layer 663 or film such as silicon nitride ($Si_3N_4$) or other nitride, a tunneling layer 664, a channel 665 (e.g., comprising polysilicon), and a dielectric core 666. A word line layer can include a blocking oxide/block high-k material 660, a metal barrier 661, and a conductive metal 662 such as Tungsten as a control gate. For example, control gates 690, 691, 692, 693 and 694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

FIG. 7 is a flowchart describing one embodiment of a programming process. The process may be used to program memory cells associated with a word line in a memory array. This might be a 2D memory array or a 3D memory array. In one embodiment, the process is used to program memory cells on different NAND strings, which may be in the same block of memory cells. The programming process may be performed on strings of memory cells in various structures such as those in FIGS. 4A, 4B, 4C, 5A, 5B, and 6, but is not limited to those structures.

In step 702, the program voltage ($V_{PGM}$) is established as an initial value. This is the program voltage that will be applied to the selected word line for the first iteration of the process. This program voltage will be stepped up during the process. Also, in step 702, a program counter (PC) is initialized to zero. The program counter tracks how many program pulses have been applied, such that programming can be aborted if the memory cell does not program within an allowed number of program pulses.

In step 704, channels of NAND strings are pre-charged. This is referred to herein as a pre-charge phase.

Step 706 is a determination of whether the word line selected for programming is an edge word line or a middle word line. If the selected word line is a middle word line, then channels of unselected NAND strings are boosted using a normal dummy word line ramp rate, in step 708a. An unselected NAND string is one that does not have a memory cell being programmed. That is, the program pulse to be applied should not program any memory cells on an unselected NAND string. Boosting the channels of unselected NAND strings helps to prevent program disturb.

If the selected word line is an edge word line, then step 707 is a determination of whether the program counter is greater than or equal to a threshold. The threshold may be set to any value including zero. A zero threshold essentially bypasses step 707. If the program counter is greater than or equal to the threshold, then channels of unselected NAND strings are boosted using a slower dummy word line ramp rate, in step 708b. If the program counter is less than the threshold, then channels of unselected NAND strings are boosted using the normal dummy word line ramp rate, in step 708a.

The test of step 707 allows step 708b to be skipped during earlier program loops. Note that during earlier program loops, the magnitude of the program voltage is typically lower than for later program loops (step 722 may increase Vpgm). A lower program voltage may cause less program disturb. By using step 708a instead of step 708b in the earlier program loops, overall programming speed can be increased without appreciable increasing program disturb, in accordance with some embodiments. Note that step 708a may be slightly slower than step 708b due to the slower ramp rate of the voltage on the dummy word line(s) and/or a delay of starting the ramping of the boosting voltage on the unselected word lines.

The value for the threshold for the test of step 707 may be stored in non-volatile storage in the memory system 100. For example, the value could be stored in storage device area 126a, storage region 113, ROM 122a, etc. Note that the value for the threshold is not required to be the same for the lifetime of the memory system. For example, the value may be based, at least in part, on a measure of wear such as a number of program erase cycles. Some memory cells may be more prone to program disturb with a higher number of program erase cycles. Hence, the value for the threshold for the test of step 707 could be lower with a higher number of program erase cycles. Also, the value for the threshold for the test of step 707 is not required to be the same for all memory cells in the memory system. For example, the physical location of a memory cell may impact its susceptibility to program disturb.

In step 710, a program pulse is applied to the selected word line. In step 712, a verification process is performed. In step 714, it is determined whether memory cells have verified that their threshold voltages are at the final target voltage for that memory cell. Note that it is not required that every memory cell for a given state is verified to be at the appropriate threshold voltage. Error correction is able to correct for some memory cells being below their target threshold voltage. Error correction is able to correct for some memory cells being over-programmed. Step 714 is referring to all states having completed programming.

If verification passes, the programming process is completed successfully (status=pass) in step 716. If all of the memory cells are not all verified, then it is determined whether the program counter (PC) is less than a maximum value such as 20. If the program counter (PC) is not less than max (step 718), then the program process has failed (step 720). If the program counter (PC) is less than a maximum value (e.g., 20), then the program counter (PC) is incremented by 1 and the program voltage is stepped up to the next value in step 722. Subsequent to step 722, the process loops back to step 704.

Figure 8A:
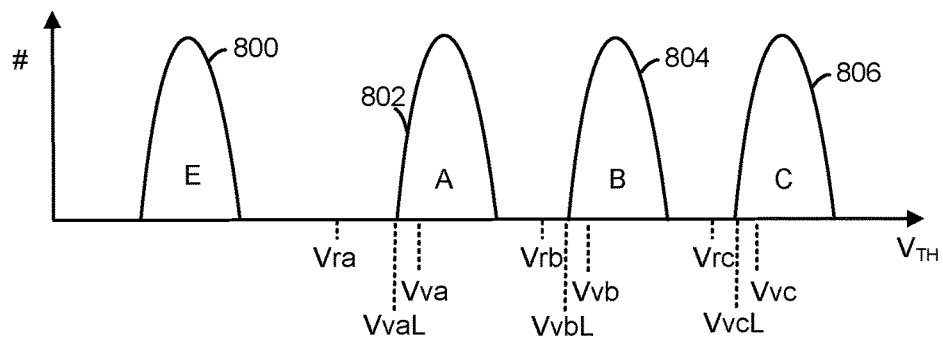
FIGS. 8A-8E depict threshold voltage distributions during embodiment of a programming process.

At the end of the programming process of FIG. 7, the memory cells on the selected word line may be programmed to a threshold voltage distributions such as depicted in FIG. 8A. The programming process may be repeated for other word lines associated with the strings of memory cells. FIG. 8A depicts one embodiment of a set of threshold voltage distributions for a four-state memory device in which each storage element stores two bits of data. A first threshold voltage (Vth) distribution 800 is provided for erased (E-state) storage elements. Three Vth distributions 802, 804 and 806 represent programmed states A, B and C, respectively. In one embodiment, the threshold voltages in the E-state and the threshold voltages in the A, B and C distributions are positive. In another embodiment, the threshold voltage distribution for the E-state is negative, while the threshold voltage distributions for the A-state, B-state and C-state distributions are positive.

Three read reference voltages, Vra, Vrb and Vrc, are also provided for reading data from storage elements. By testing whether the threshold voltage of a given storage element is above or below Vra, Vrb and Vrc, the system can determine the state, e.g., programming condition, the storage element is in.

Further, three verify reference voltages, Vva, Vvb and Vvc, are provided. When programming storage elements to the A-state, B-state or C-state, the system will test whether those storage elements have a threshold voltage greater than or equal to Vva, Vvb or Vvc, respectively.

In one embodiment, known as full sequence programming, storage elements can be programmed from the E-state directly to any of the programmed states A, B or C. For example, a population of storage elements to be programmed may first be erased so that all storage elements in the population are in the E-state. A series of program pulses, such as depicted in FIG. 8F, may then be used to program storage elements directly into states A, B or C. While some storage elements are being programmed from the E-state to the A-state, other storage elements are being programmed from the E-state to the B-state and/or from the E-state to the C-state.

Another option is to use low and high verify levels for one or more data states. For example, VvaL and Vva are lower and higher verify levels, respectively, for the A-state, VvbL and Vvb are lower and higher verify levels, respectively, for the B-state, and VvcL and Vvc are lower and higher verify levels, respectively, for the C-state. In some cases, VvcL is not used since reduced programming precision may be acceptable for the highest state. During programming, when the Vth of a storage element which is being programmed to the A-state as a target state exceeds VvaL, the programming speed of the storage element is slowed down, in a slow programming mode, such as by raising the associated bit line voltage to a level, e.g., 0.6-0.8 V, which is between a nominal program or non-inhibit level, e.g., 0 V and a full inhibit level, e.g., 4-6 V. This provides greater accuracy by avoiding large step increases in threshold voltage. When the Vth reaches Vva, the storage element is locked out from further programming. Similarly, when the Vth of a storage element which is being programmed to the B-state as a target state exceeds VvbL, the programming speed of the storage element is slowed down, and when the Vth reaches Vvb, the storage element is locked out from further programming. Optionally, when the Vth of a storage element which is being programmed to the C-state as a target state exceeds VvcL, the programming speed of the storage element is slowed down, and when the Vth reaches Vvc, the storage element is locked out from further programming. This programming technique has been referred to as a quick pass write or dual verify technique. Note that, in one approach, dual verify levels are not used for the highest state since some overshoot is typically acceptable for that state. Instead, the dual verify levels can be used for the programmed states, above the erased state, and below the highest state.

Figure 8B:
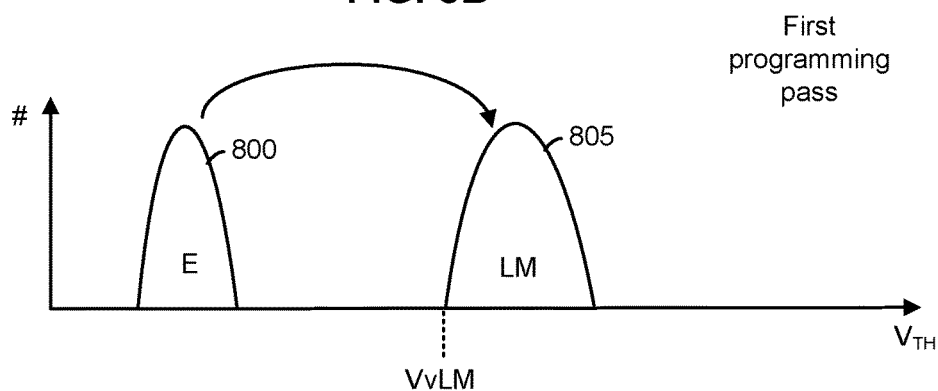

FIG. 8B depicts one embodiment of a first pass of a two-pass programming technique. In this example, a multi-state storage element stores data for two different pages: a lower page and an upper page. Four states are depicted by repeating the threshold voltage distributions 800, 802, 804 and 806 from FIG. 8A. These states, and the bits they represent, are: E-state (11), A-state (01), B-state (00) and C-state (10). For E-state, both pages store a "1." For A-state, the lower page stores a "1" and the upper page stores a "0." For B-state, both pages store "0." For C-state, the lower page stores "0" and the upper page stores "1." Note that although specific bit patterns have been assigned to each of the states, different bit patterns may also be assigned.

In the first programming pass, the lower page is programmed for a selected word line WLn. If the lower page is to remain data 1, then the storage element state remains at state E (distribution 800). If the data is to be programmed to 0, then the threshold voltage of the storage elements on WLn are raised such that the storage element is programmed to an intermediate (LM or lower-middle) state (distribution 805).

Figure 8C:
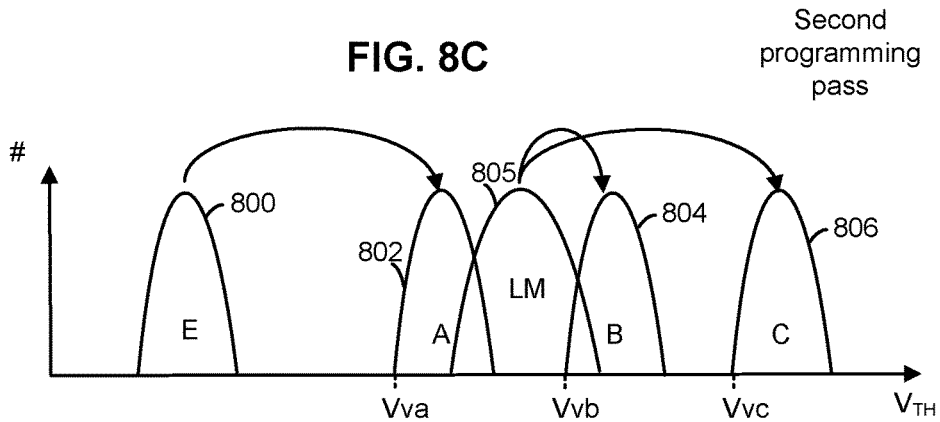

FIG. 8C depicts one embodiment of a second pass of the two-pass programming technique referred to in FIG. 8B. The A-state storage elements are programmed from the E-state distribution 800 to the A-state distribution 802, the B-state storage elements are programmed from the LM-state distribution 805 to the B-state distribution 804, and the C-state storage elements are programmed from the LM-state distribution 805 to the C-state distribution 806.

Figure 8D:
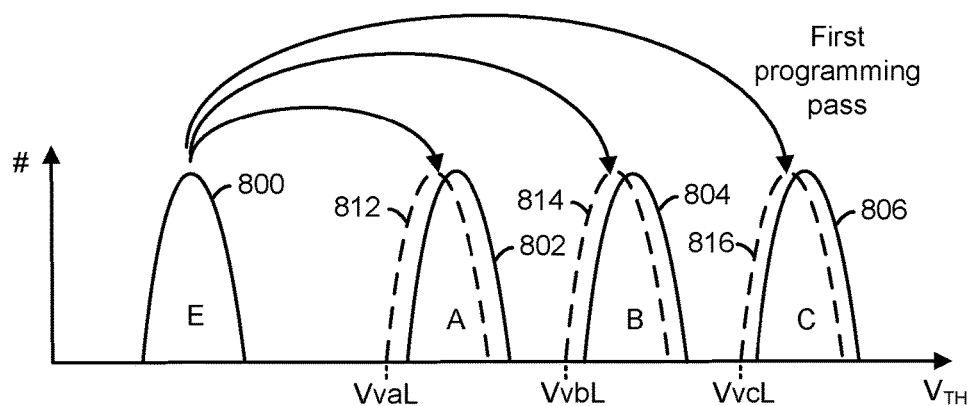

FIG. 8D depicts one embodiment of a first pass of another two-pass programming technique. In this example, referred to as foggy-fine (or course-fine) programming, the A-state, B-state and C-state storage elements are programmed from the E-state to distributions 812, 814 and 816, respectively, using lower verify levels VvaL, VvbL and VvcL, respectively. This is the foggy (or course) programming pass. A relatively large program voltage step size may be used, for instance, to quickly program the storage elements to the respective lower verify levels.

Figure 8E:
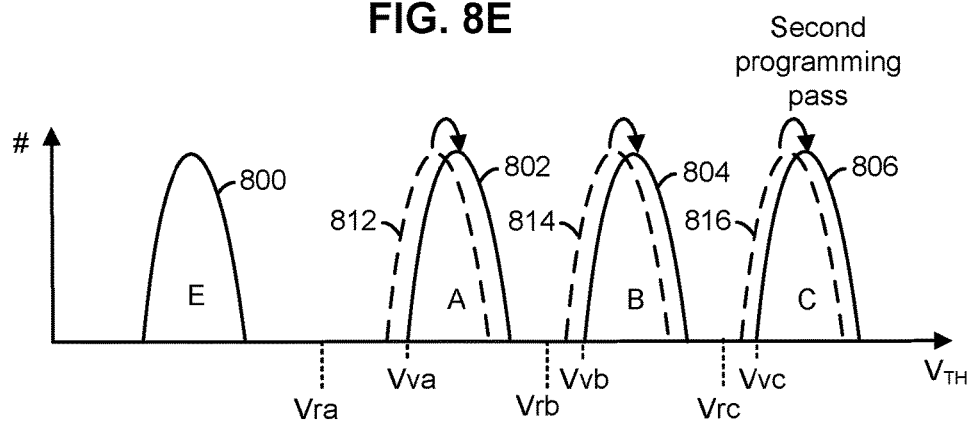
Figure 8F:
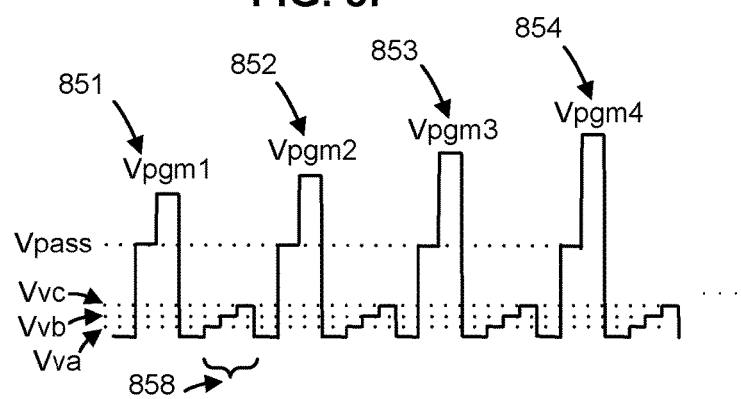
FIG. 8F depicts one embodiment of a series of program and verify pulses which are applied to a selected word line during a programming operation.

FIG. 8E depicts one embodiment of a second pass of the two-pass programming technique referred to in FIG. 8D. The A-state, B-state and C-state storage elements are programmed from the respective lower distributions to respective final distributions 802, 804 and 806, respectively, using the nominal, higher verify levels Vva, Vvb and Vvc, respectively. This is the fine programming pass. A relatively small program voltage step size may be used, for instance, to slowly program the storage elements to the respective final verify levels while avoiding a large overshoot.

Although the programming examples depict four data states and two pages of data, the concepts described herein may be applied to other implementations with more or fewer than four states and more or fewer than two pages. For example, memory devices may utilize eight or sixteen states per storage element. Moreover, in the example programming techniques discussed herein, the Vth of a storage element may be raised gradually as it is programmed to a target data state. However, programming techniques may be used in which the Vth of a storage element may be lowered gradually as it is programmed to a target data state. Programming techniques which measure storage element current may be used as well. The concepts described herein may be adapted to the different programming techniques.

FIG. 8F depicts one embodiment of a series of program and verify pulses which are applied to a selected word line during a programming operation. A programming operation may include multiple program-verify iterations, in which each iteration applies one or more programming voltages followed by one or more verify voltages to the selected word line. In one embodiment, the programming voltages applied in a previous iteration may be stepped up in successive iterations. Moreover, the one or more programming voltages applied during a programming iteration may include a first portion which has a pass voltage (Vpass) level, e.g., 6-8 V, followed by a second, highest amplitude portion at a program level, e.g., 12-25 V. For example, a first, second, third and fourth program pulses 851, 852, 853 and 854 have program levels of Vpgm1, Vpgm2, Vpgm3 and Vpgm4, respectively. One or more verify voltages 858, such as verify voltages Vva, Vvb and Vvc, may be provided after each program pulse. In some cases, one or more initial program pulses are not followed by verify pulses because it is not expected that any storage elements have reached the lowest program state (e.g., A-state). Subsequently, in some cases, program iterations may use verify pulses for the A-state, followed by program iterations which use verify pulses for the A-states and B-states, followed by program iterations which use verify pulses for the B-states and C-states.

Figure 9:
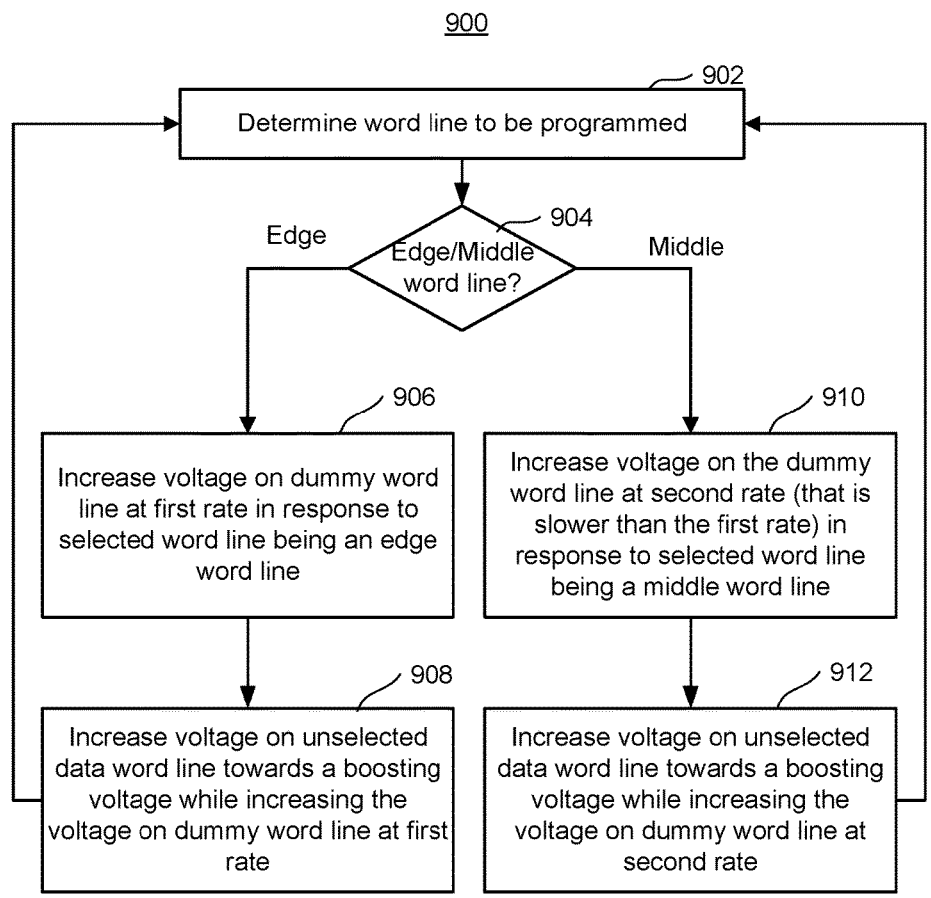
FIG. 9 is a flowchart of one embodiment of a programming process in which the ramp rate of a voltage on a dummy word line may depend on the location of the word line selected for programming.

FIG. 9 is a flowchart of one embodiment of a programming process 900 in which the ramp rate of a voltage on a dummy word line may depend on the location of the word line selected for programming. The process 900 may be used to program a set of strings of memory cells, such as NAND strings in a block. The process 900 may be used to implement some of the steps of the programming process of FIG. 7, as will be explained below. The process 900 may be performed by a control circuit in memory system 100. The process 900 is described with respect to programming different word lines, which may be in the same block. For example, the control circuit may go through a process of programming all of the word lines in a block. However, note that programming all of the word lines in the block is not required.

Step 902 is to determine the word line to be programmed. In one embodiment, the control circuit maps a logical address provided by a host to a physical address in the memory structure 126. Step 904 is a determination of whether the selected word line is an edge word line. There is a set of one or more edge word lines at each end of the string of memory cells. Steps 902-904 are one embodiment of step 706 of FIG. 7.

If the selected word line is an edge word line, then steps 906-908 are performed. Steps 906-908 are one embodiment of step 708b of FIG. 7. In step 906, a voltage on the dummy word line is increased at a first rate to a dummy word line voltage in response to the selected word line being an edge word line. FIG. 1B depicts one example of step 906. From time T1 to T3, the voltage on DWLn is increased from 0V to Vd0. Also, from time T1 to T3, the voltage on DWL+1 is increased from 0V to Vd1. In one embodiment, to increase a voltage on the dummy word line at the first rate, the control circuit is configured to apply a voltage waveform that has a first slope to the dummy word line.

The dummy word line in step 906 includes a dummy word line that neighbors the selected word line. By "neighboring" the selected word line, it is meant the selected word line is at the same end of the string (e.g., the drain or source end). Neighboring includes the case in which there are no other word lines between the dummy and the selected word line, but may include the case in which one or a few word lines are between the dummy and the selected word line. For example, if the selected word line is in WLL10 (see FIG. 5A or 5B), then the dummy word lines in WLD1 and WLD2 both neighbor the selected word line. However, the dummy word lines in WLD3 and WLD4 do not neighbor the selected word line in WLL10.

Step 906 may be applied to more than one dummy word line. For example, step 906 may be applied to both (or just one of) the dummy word lines in WLD1 and WLD2. Step 906 may be applied to dummy word lines that do not neighbor the selected word line, although this is not a requirement. For example, step 906 may be applied to WLD3 and WLD4, which do not neighbor the selected word line in WLL10 (of this example). Note that the selected word line could instead be that the source end (such as in WLL0, WLL1, etc.).

In step 908, the voltage on unselected data lines is increased towards a boosting voltage while increasing the voltage on the dummy word line at the first rate. Stated another way, the voltage on unselected data lines is increased towards a boosting voltage while increasing the voltage on the dummy word line towards the dummy word line voltage. FIG. 1B depicts one example of step 908. From time T2 to T3, the voltage on WLunsel is increased from 0V to Vpass. Note that this occurs while increasing the voltage on the dummy word line at the first rate. Also, this occurs while increasing the voltage on the dummy word line towards the dummy word line voltage.

After step 908, the process returns to step 902. In step 902 another word line may be selected for programming. The process may continue until all word lines in the block are programmed, but is not required to program all word lines. When it is determined in step 904 that the selected word line is a middle word line, steps 910-912 are performed. Steps 910-912 are one embodiment of step 708a of FIG. 7.

In step 910, a voltage on the dummy word line is increased to a dummy word line voltage at a second rate in response to the selected word line being other than an edge word line. Step 910 is applied to the same dummy word lines as in step 906, in one embodiment. The dummy word line voltage (for a particular dummy word line) may have the same magnitude as the dummy word line voltage in step 906, but this is not required.

The second rate in step 901 is faster than the first rate of step 906 (for a particular dummy word line). The second rate is a normal rate, in one embodiment. The first rate is slower than the normal rate, in one embodiment. FIG. 1C depicts one example of step 910. From time T1 to T2, the voltage on DWLn is increased from 0V to Vd0. Also, from time T1 to T2, the voltage on DWL+1 is increased from 0V to Vd1. In one embodiment, to increase a voltage on the dummy word line at the second rate, the control circuit is configured to apply a voltage waveform that has a second slope to the dummy word line, wherein the second slope is greater than the first slope used in step 906.

Figure 10A:
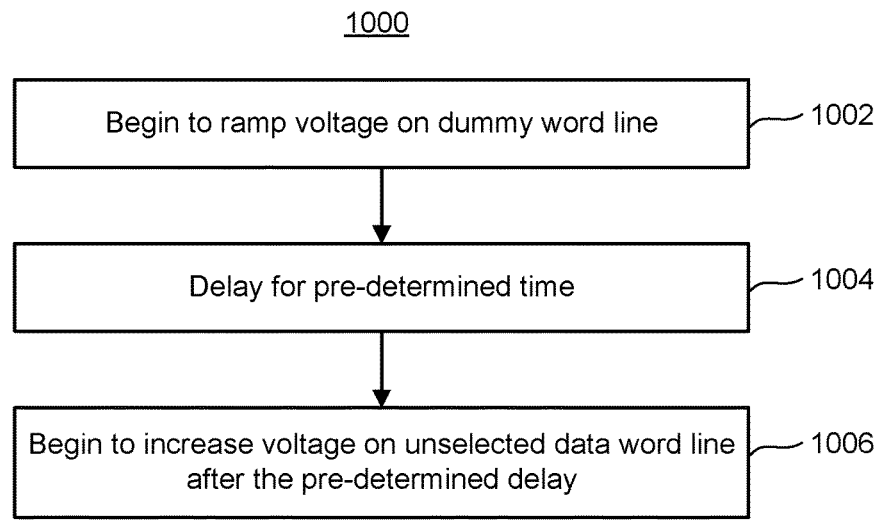
FIG. 10A describes one embodiment of a process in which a delay of applying a boosting voltage to unselected word lines is achieved based on a pre-determined time delay.
Figure 10B:
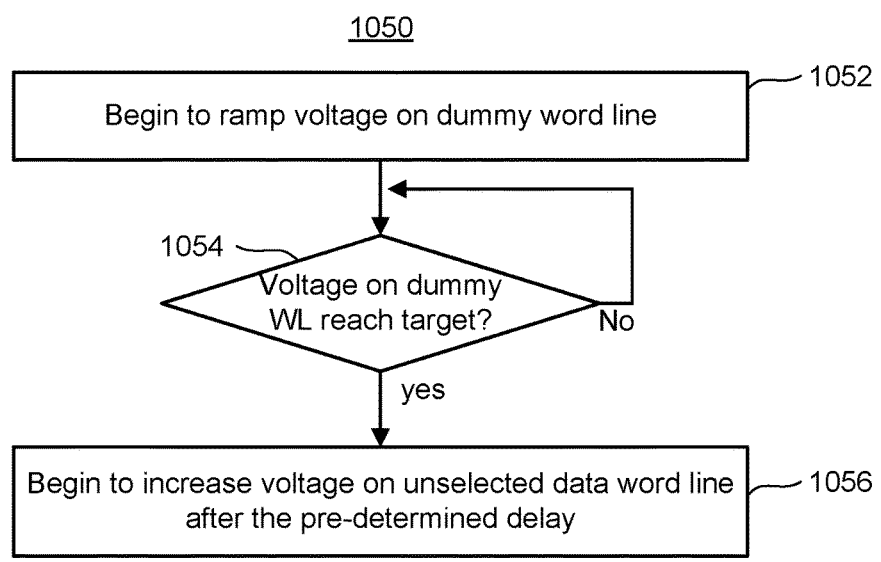
FIG. 10B describes one embodiment of a process in which a delay of applying a boosting voltage to unselected word lines is achieved based on a measurement of a voltage on the dummy word line.

In step 912, the voltage on unselected data lines is increased towards a boosting voltage while increasing the voltage on the dummy word line at the second rate. Stated another way, the voltage on unselected data lines is increased towards a boosting voltage while increasing the voltage on the dummy word line towards the dummy word line voltage. FIG. 1C depicts one example of step 912. From time T1 to T2, the voltage on WLunsel is increased from 0V to Vpass. Note that this occurs while increasing the voltage on the dummy word line at the second rate. Also, this occurs while increasing the voltage on the dummy word line towards the dummy word line voltage. Also note that the rate at which the voltage is increased on the unselected word lines is independent As is indicated in the timing diagram of FIG. 1B, the voltage may begin to increase on the unselected selected word lines after some delay with respect to when the voltage begins to increase on the dummy word line(s). FIGS. 10A and 10B are flowcharts of two alternatives of achieving the delay. A suitable delay may be used such that the voltage ramps up on the unselected word lines towards the boosting voltage while the voltage is still ramping up on the dummy word line. Stated in other words, a suitable delay may be used such that there is some overlap of the ramping of the voltages on the dummy and unselected word lines. In one embodiment, the delay is selected to avoid the voltage on the dummy word line from reaching its target voltage prior to beginning to start to increase the voltage on the unselected word lines.

Note that in one embodiment, a slower than normal ramp rate may be used when the selected word line is at one end of the string, but not the other end of the string. For example, a slower than normal ramp rate may be used for dummy word lines on the drain end of the string when the selected word line is near the drain end. However, if the selected word line is near the source end, a normal ramp rate could be used for all dummy word lines. As another example, a slower than normal ramp rate may be used for dummy word lines on the source end of the string, when the selected word line is near the source end. However, if the selected word line is near the drain end, a normal ramp rate could be used for all dummy word lines.

FIG. 10A describes one embodiment of a process 1000 in which the delay is achieved based on a pre-determined time delay. In this embodiment, the pre-determined time delay may be based on a parameter in storage device area 126a, storage region 113, ROM 122a, etc. The state machine 112 may use this parameter to determine when to instruct power control 116 to apply voltages to the word lines. Power control 116, in turn, may cause voltage driver 460 (see FIG. 4B) to apply a voltage to the word line.

This parameter may be determined based on a study of the typical time it takes for the voltage on the dummy and unselected word lines to ramp up. For example, typical times for the dummy voltage to go from 0V to Vd0 or Vd1 may be determined. This time may be established as the gap between time T1 and T3 in FIG. 1B. A suitable gap between time T1 and T2 may be determined based on how long it typically takes for the voltage on the unselected word line to go from 0V to Vpass. Thus, the delay between T1 and T2 may be designed such that the voltage on the dummy and the unselected word lines reach their targets at about the same time (e.g., T3). However, note that this is just one example. It is not required that the voltage on the dummy and the unselected word lines reach their targets at about the same time. For example, it is possible for the dummy or the unselected word lines to reach their target voltage at a time other than T3.

In step 1002, the control circuit begins to ramp the voltage on the dummy word line. In one embodiment, voltage driver 460 (see FIG. 4B) begins to apply a voltage to the dummy word line at time T1. This may be in response to a control signal from state machine 112, as one example.

Step 1004 is a delay for a pre-determined time. As noted, this may be based on a parameter in storage.

Step 1006 is to begin to ramp the voltage on unselected word lines after the pre-determined delay. In one embodiment, voltage driver 460 begins to apply a voltage to the unselected word lines at time T2 (see FIG. 1B). This may be in response to a control signal from state machine 112, as one example.

FIG. 10B describes one embodiment of a process 1050 in which the delay is achieved based on a measurement of a voltage on the dummy word line. In this embodiment, a voltage detector circuit 470 may be used to sense the voltage on the dummy word line.

In step 1052, the control circuit begins to ramp the voltage on the dummy word line. In one embodiment, voltage driver 460 (see FIG. 4B) begins to apply a voltage to the dummy word line at time T1 in response to a control signal from state machine 112.

Step 1054 is a determination of whether the voltage on the dummy word line has reached a target voltage. As noted, step 1054 may include voltage detector circuit 470 sensing the voltage on the dummy word line. Referring to FIG. 1B, the target voltage may be Vtarn with respect to DWLn. The target voltage may be Vtarn+1 with respect to DWLn+1. It is not required that the voltage on both dummy word lines be sensed. Either the present voltage, or an indicator that the target voltage has been reached may be reported by the voltage detector circuit 470 to the state machine 112 or processor 122c, depending on the implementation. The target voltage may be based on factors similar to already discussed above with respect to the pre-determined delay.

Step 1056 is to begin to ramp the voltage on unselected word lines after the voltage on the dummy word line reaches the target voltage. In one embodiment, voltage driver 460 (see FIG. 4B) begins to apply a voltage to the unselected word lines in response to a control signal from state machine 112. Note that in the example of FIG. 1B, the target voltage corresponds to time T2. However, this is not required. In other words, the voltage Vtarn could occur at a point other than T2. Likewise, the voltage Vtarn+1 could occur at a point other than T2.

Figure 11:
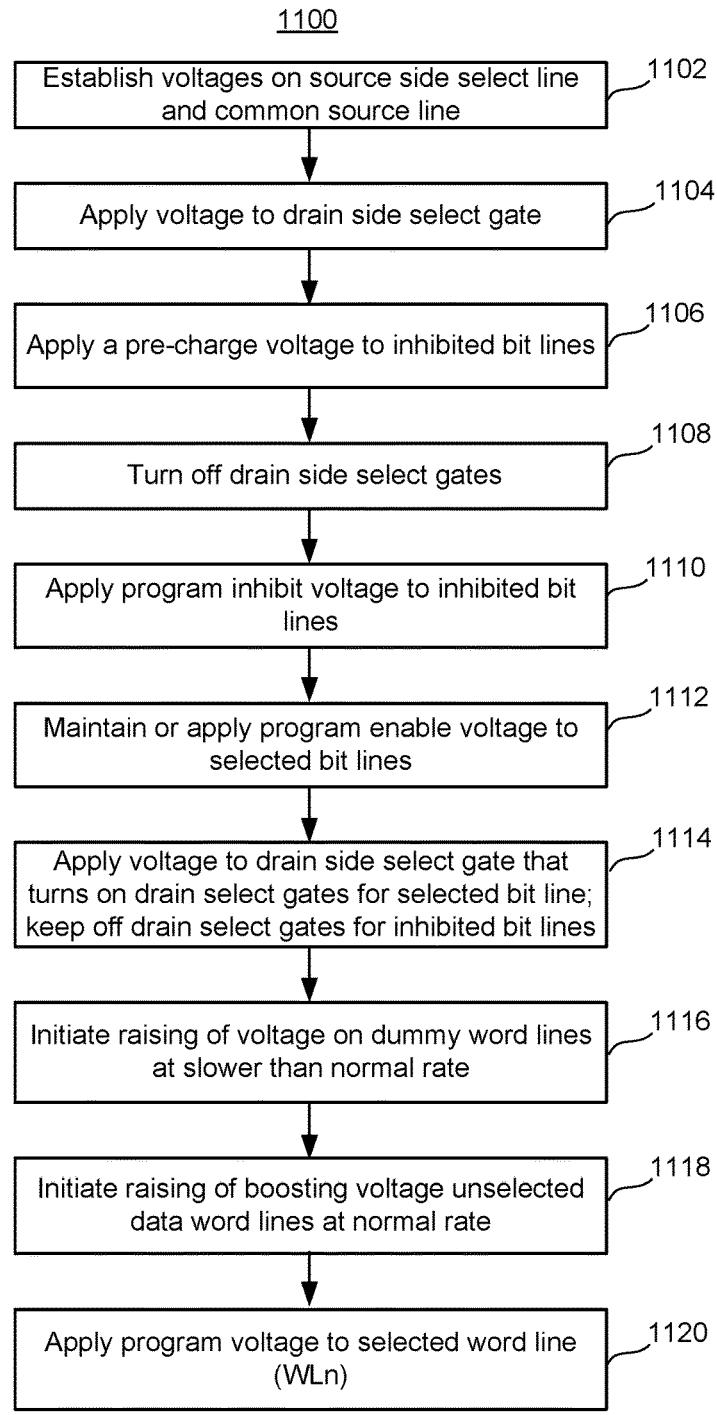
FIG. 11 is a flowchart of one embodiment of a process of applying various voltages during a programming operation in which a voltage applied to a dummy word line is slower than a normal rate.
Figure 12:
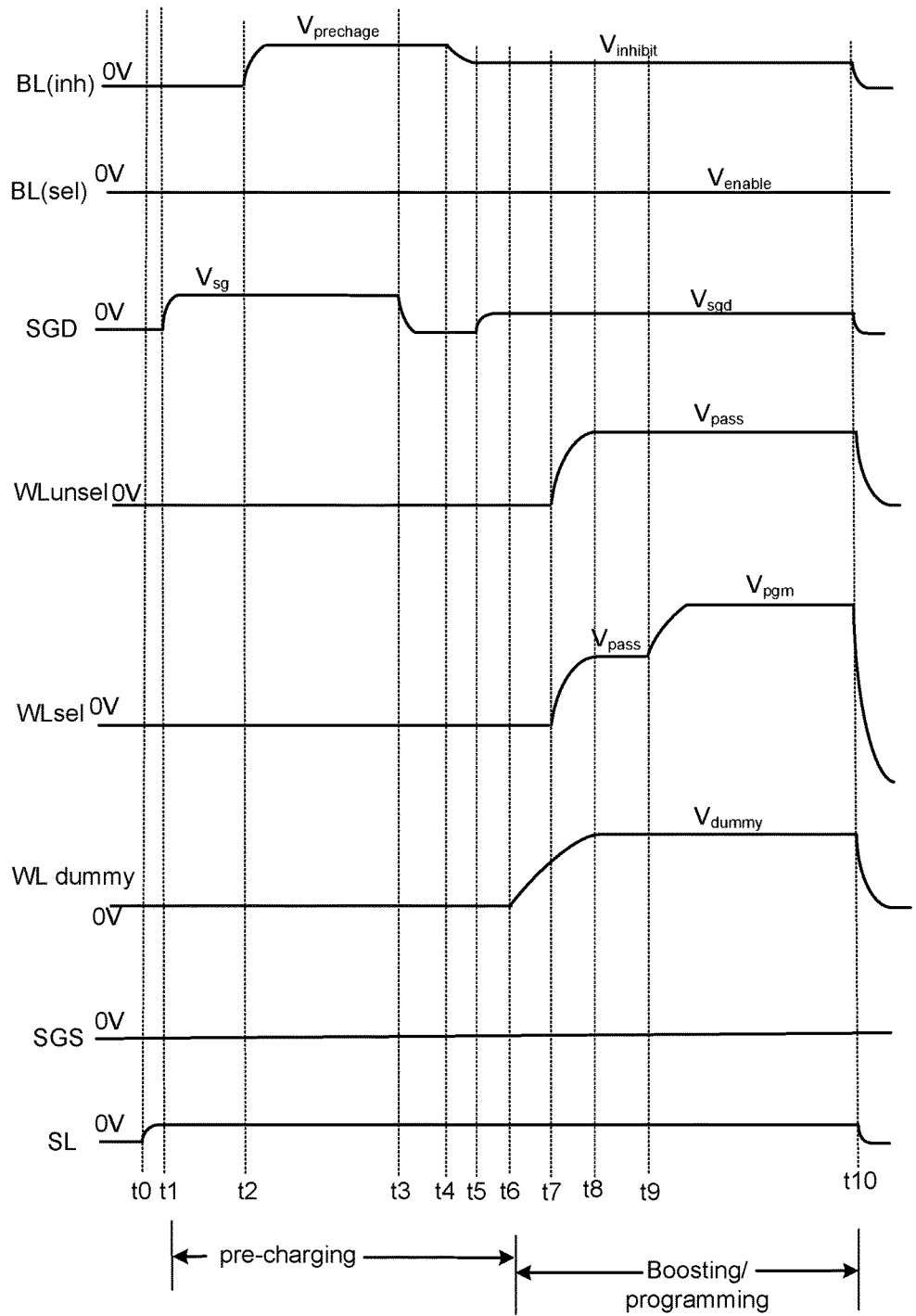
FIG. 12 is a timing diagram of signals applied during one embodiment of process of FIG. 11.

FIG. 11 is a flowchart of one embodiment of a process 1100 of applying various voltages during a programming operation in which a voltage applied to a dummy word line is slower than a normal rate. FIG. 12 is a timing diagram of signals applied during one embodiment of process 1100. Process 1100 and the timing diagram of FIG. 12 are just one possible technique. Other variations are possible.

In step 1102, voltages are established on the source side select line (e.g., SGS) and the common source line. In one embodiment, a low voltage (e.g., about 1.0V-1.5V) is applied to the common source line. The low voltage may remain for the duration of the programming process. For example, at t0, FIG. 12 shows the low voltage applied to SL. The source line SL is kept at 0V in some embodiments. Note that the source side select gate line SGS may remain at 0V throughout the programming process, as depicted in FIG. 12. This keeps the source side select gates off throughout the process, in one embodiment. Thus, the source select gates are placed into isolation mode, in one embodiment.

A voltage is applied to the drain select gates at step 1104. This voltage may be sufficient to place the drain side select gates (of both program inhibited NAND strings and program enabled NAND strings) into a conductive state. FIG. 12 shows $V_{SG}$ applied to SGD at t1. $V_{SG}$ is a positive bias in one embodiment. $V_{SG}$ is on the order of about 3.5V to 4.5V, in one embodiment.

Optionally, a pre-charge enable voltage may be applied to word lines associated with the NAND strings. In one embodiment, the pre-charge enable voltage is 0V. FIG. 12 shows 0V applied to the dummy WL, selected WL and unselected WLs at time t2. Alternatively, a slight positive voltage may be applied at time t2. The magnitude of the pre-charge enable voltage can be word line dependent. For example, the selected word line might have a greater pre-charge enable voltage than non-selected word lines. In one embodiment, the pre-charge enable voltage is large enough to place memory cells in the erased state into a conductive state. In one embodiment, all of the memory cells between the bit line and the selected word line are in the erased state, due to programming occurring from the word line nearest the source line to the word line nearest the bit line. Hence, the pre-charge enable voltage places all of the memory cells between the selected word line and the bit line into a conductive state, in one embodiment. The memory cell at the selected word line may also be placed into a conductive state, depending on its present threshold voltage. Memory cells on the source side of the selected word line might or might not be made conductive by the pre-charge enable voltage.

At step 1106, a pre-charge voltage is applied to the program inhibited bit lines. For example, FIG. 12 shows $V_{precharge}$ applied to the unselected bits lines at t2. Because the drain side select gates of the program inhibited NAND strings are turned on at this time, the bit line voltage will be passed to the channels of the program inhibited NAND strings. This results in charging the potential of at least a portion of the NAND string channel to approximately $V_{precharge}$. However, the entire program inhibited NAND string does not necessarily get charged to $V_{precharge}$. It is possible for some of the memory cells to be in a non-conductive state, as discussed above. Thus, in one embodiment, the pre-charge voltage passes as far into the program inhibited NAND channel as it is conductive.

At step 1108, the drain side select line voltage is lowered. FIG. 12 shows the SGD decreased from $V_{SG}$ to 0V at t3. Lowering the drain side select line voltage turns off the drain side select gates of both the program enabled NAND strings and the program inhibited NAND strings. This disconnects both selected and unselected NAND strings from their respective bit lines. This allows the pre-charge voltage in the channels of the unselected NAND strings to be maintained.

Step 1110 is to apply a program inhibit voltage to the program inhibited bit lines. FIG. 12 shows the voltage on unselected bit lines (BL(inh)) being reduced from the pre-charge voltage $V_{precharge}$ to $V_{INHIBIT}$ between times t4 and t5. In another embodiment, $V_{precharge}$ and $V_{INHIBIT}$ have the same magnitude. In another embodiment, $V_{precharge}$ has a lower magnitude than $V_{INHIBIT}$.

Step 1112 is to apply (or at least maintain) a program enable voltage on selected bit lines. In one embodiment, the program enable voltage is 0V. It may be the case that the selected bit lines are already at 0V. FIG. 12 shows the voltage on selected bit lines (BL(sel)) being at $V_{ENABLE}$ at t5. In one embodiment, values are stored in a latch associated with each NAND string to indicate whether the NAND string should be programmed or inhibited.

At step 1114, the voltage on the drain side select line (e.g., SGD) is increased to a voltage that allows the unselected bit lines to remain disconnected from their bit NAND strings, but for which the selected bit lines are connected to their NAND strings. In other words, the drain side select gates for unselected NAND strings are off, whereas the drain side select gates for selected NAND strings are on. Note that the channel region of those NAND strings that are to be inhibited from programming are cutoff from their bit line, enabling boosting of those channel regions as hereinafter described. FIG. 12 shows the voltage on SGD increasing to $V_{SGD}$ at t5.

Note that the voltages on the bit lines may also impact whether the drain side select gates are on/off. In one embodiment, the voltages $V_{INHIBIT}$ and $V_{SGD}$ are suitable values to keep the drain side select gates of unselected NAND strings off. On the other hand, the voltages $V_{ENABLE}$ and $V_{SGD}$ are suitable values to keep the drain side select gates of selected NAND strings on.

Step 1116 includes initiating the raising of the voltage on dummy word lines are a slower than normal rate. This may include all of the dummy word lines on the same end of the NAND string as the edge word line selected for programming. It is not required that dummy word lines on the other end of the NAND string have a slower than normal ramp rate, but that is one possibility. FIG. 12 shows the voltage on WL dummy increasing at time t6.

At step 1118, a boosting voltage (e.g., $V_{PASS}$) is initiated on unselected data word lines. Also, the boosting voltage may be initiated on the selected word line. FIG. 12 shows the voltage on the WLunsel and WLsel beginning to increase towards $V_{PASS}$ at t7.

The boosting voltage causes the channel potential adjacent to the word lines to increase. In one embodiment, capacitive coupling between the respective control gates and channel lifts the channel potential. Thus, the pass voltage that is applied to the control gate may serve to boost a portion of the channel potential adjacent to the control gate.

The program voltage $V_{PGM}$ is then applied to the selected word line at step 1020. FIG. 12 show the selected word line being increased from $V_{PASS}$ to $V_{PGM}$ are t9. Thus, programming of memory cells connected to the selected word and for which the NAND string is enabled for programming have their threshold voltages raised, in one embodiment. When the program voltage is applied, the boosting voltages may be maintained on the unselected word lines. Thus, the boosted channel prevents programming of the memory cells connected to the selected word line and for which the NAND string is inhibited from programming.

Afterwards, the word lines, bit lines, source line, and drain select gate line are lowered to 0V, marking the completion of one programming iteration. This is illustrated after t10 of FIG. 12, in which the various voltages are lowered.

One embodiment disclosed herein includes a non-volatile storage system, comprising: a plurality of strings of non-volatile memory cells; a plurality of word lines associated with the plurality of strings of non-volatile memory cells, and a control circuit in communication with the plurality of word lines. The plurality of word lines comprise a dummy word line and a plurality of data word lines. The plurality of data word lines comprises one or more edge word lines and a group of middle word lines. The control circuit is configured to: increase a voltage on the dummy word line to a first dummy word line voltage at a first rate when the data word line that is selected for programming is an edge word line; increase a voltage on unselected data word lines towards a boosting voltage while the voltage on the dummy word line increases towards the first dummy word line voltage; increase a voltage on the dummy word line to a second dummy word line voltage at a second rate that is faster than the first rate when the data word line that is selected for programming is a middle word line; and increase a voltage on the unselected data word lines towards a boosting voltage while the voltage on the dummy word line increases towards the second dummy word line voltage.

One embodiment disclosed herein includes a method of operating non-volatile storage comprising a plurality of strings of non-volatile memory cells and a plurality of word lines associated with the plurality of strings of non-volatile memory cells. The plurality of word lines comprise one or more dummy word lines and a plurality of data word lines. The plurality of data word lines comprise one or more edge word lines and a group of middle word lines. The method comprises increasing a voltage on a first of the dummy word lines at a first rate in response to the word line that is selected for programming being an edge word line; increasing a voltage on unselected data word lines towards a boosting voltage while increasing the voltage on the first dummy word line at the first rate; increasing a voltage on the first dummy word line at a second rate that is faster than the first rate in response to the word line that is selected for programming being a middle word line; and increasing a voltage on the unselected data word lines towards a boosting voltage while increasing the voltage on the first dummy word line at the second rate.

One embodiment disclosed herein includes a non-volatile storage system, comprising: a plurality of bit lines; a common source line; a plurality of NAND strings; and a plurality of word lines associated with the plurality of NAND strings. Each NAND string comprises a set of data non-volatile memory cells, a drain side select gate, a source side select gate, one or more first dummy memory cells between the drain side select gate and the set of data non-volatile memory cells, and one or more second dummy memory cells between the source side select gate and the set of data non-volatile memory cells. The plurality of word lines comprise one or more first dummy word lines connected to respective ones of the one or more first dummy memory cells of each of the plurality of NAND strings, one or more second dummy word lines connected to respective ones of the one or more second dummy memory cells of each of the plurality of NAND strings, and a plurality of data word lines connected to respective ones of the set of data non-volatile memory cells. The plurality of data word lines comprise one or more first edge word lines neighboring the one or more first dummy word lines, one or more second edge word lines neighboring the one or more second dummy word lines, and a group of middle word lines between the first and second edge word lines. The non-volatile storage system further comprises means for applying a voltage that has a first slope to an individual one of the one or more first dummy word lines in response to the word line that is selected for programming being a first edge word line; means for increasing a voltage on unselected data word lines towards a boosting voltage while applying the voltage that has the first slope to the individual dummy word line; means for applying a voltage that has a second slope that is greater than the first slope to the individual dummy word line in response to the word line that is selected for programming being a middle word line; and means for increasing a voltage on the unselected data word lines towards a boosting voltage while applying the voltage that has a second slope to the individual dummy word line.

In one embodiment, the means for applying a voltage that has a first slope to an individual one of the one or more first dummy word lines in response to the word line that is selected for programming being a first edge word line comprises one or more of control circuitry 110, state machine 112, power control 116, controller 122, processor 122c, read/write circuits 128, and/or voltage driver 460. The means for applying a voltage that has a first slope to an individual one of the one or more first dummy word lines in response to the word line that is selected for programming being a first edge word line may comprise other electronic circuitry.

In one embodiment, the means for increasing a voltage on unselected data word lines towards a boosting voltage while applying the voltage that has the first slope to the individual dummy word line comprises one or more of control circuitry 110, state machine 112, power control 116, controller 122, processor 122c, read/write circuits 128, and/or voltage driver 460. The means for increasing a voltage on unselected data word lines towards a boosting voltage while applying the voltage that has the first slope to the individual dummy word line may comprise other electronic circuitry.

In one embodiment, the means for applying a voltage that has a second slope that is greater than the first slope to the individual dummy word line in response to the word line that is selected for programming being a middle word line comprises one or more of control circuitry 110, state machine 112, power control 116, controller 122, processor 122c, read/write circuits 128, and/or voltage driver 460. The means for applying a voltage that has a second slope that is greater than the first slope to the individual dummy word line in response to the word line that is selected for programming being a middle word line may comprise other electronic circuitry.

In one embodiment, the means for increasing a voltage on the unselected data word lines towards a boosting voltage while applying the voltage that has a second slope to the individual dummy word line comprises one or more of control circuitry 110, state machine 112, power control 116, controller 122, processor 122c, read/write circuits 128, and/or voltage driver 460. The means for increasing a voltage on the unselected data word lines towards a boosting voltage while applying the voltage that has a second slope to the individual dummy word line may comprise other electronic circuitry.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. A non-volatile storage system, comprising:
a plurality of strings of non-volatile memory cells;
a plurality of word lines associated with the plurality of strings of non-volatile memory cells, the plurality of word lines comprising a dummy word line and a plurality of data word lines, the plurality of data word lines comprising one or more edge word lines and a group of middle word lines; and
a control circuit in communication with the plurality of word lines, the control circuit configured to:
increase a voltage on the dummy word line from a steady state voltage to a first dummy word line voltage at a first rate when the data word line that is selected for programming is an edge word line;
increase respective voltages on unselected data word lines from the steady state voltage towards respective boosting voltages after the control circuit begins to increase the voltage on the dummy word line and while the voltage on the dummy word line increases towards the first dummy word line voltage;
increase a voltage on the dummy word line from the steady state voltage to a second dummy word line voltage at a second rate that is faster than the first rate when the data word line that is selected for programming is a middle word line; and
increase respective voltages on the unselected data word lines from the steady state voltage towards respective boosting voltages while the voltage on the dummy word line increases towards the second dummy word line voltage.

2. The non-volatile storage system of claim 1, wherein to increase the voltage on the dummy word line from the steady state voltage to the second dummy word line voltage at the second rate the control circuit is further configured to:
begin to increase the voltage on the dummy word line at the same time the control circuit begins to increase the respective boosting voltages on unselected data word lines.

3. The non-volatile storage system of claim 1, wherein to increase the voltage on the dummy word line from the steady state voltage to the first dummy word line voltage at the first rate when the data word line that is selected for programming is an edge word line the control circuit is configured to:
increase the voltage on the dummy word line at the first rate only when a program loop count with respect to the selected word line is greater than or equal to a threshold.

4. The non-volatile storage system of claim 3, wherein the control circuit is further configured to:
increase the voltage on the dummy word line at the second rate when the selected word line is an edge word line and the program loop count is less than the threshold.

5. The non-volatile storage system of claim 1, wherein the first dummy word line voltage and the second dummy word line voltage are the same magnitude.

6. The non-volatile storage system of claim 5, wherein:
to increase a voltage on the dummy word line from the steady state voltage to a first dummy word line voltage at a first rate when the data word line that is selected for programming is an edge word line the control circuit is configured to apply a voltage waveform that has a first slope to the dummy word line; and
to increase a voltage on the dummy word line from the steady state voltage to a second dummy word line voltage at a second rate that is faster than the first rate when the data word line that is selected for programming is a middle word line the control circuit is configured to apply a voltage waveform that has a second slope to the dummy word line, wherein the second slope is greater than the first slope.

7. The non-volatile storage system of claim 1, further comprising:

a voltage detection circuit configured to detect a voltage on the dummy word line;

wherein to increase the respective voltages on unselected data word lines towards the respective boosting voltages while the voltage on the dummy word line increases towards the first dummy word line voltage the control circuit is configured to begin to increase the respective voltages on unselected data word lines in response to the voltage on the dummy word line reaching a target voltage.

8. A method of operating non-volatile storage comprising a plurality of strings of non-volatile memory cells and a plurality of word lines associated with the plurality of strings of non-volatile memory cells, the plurality of word lines comprising one or more dummy word lines and a plurality of data word lines, the plurality of data word lines comprising one or more edge word lines and a group of middle word lines, the method comprising:

increasing a first voltage on a first of the dummy word lines from a steady state voltage at a first rate in response to the word line that is selected for programming being an edge word line;

increasing respective voltages on unselected data word lines from the steady state voltage towards respective boosting voltages while increasing the first voltage on the first dummy word line at the first rate, including beginning to increase the respective boosting voltages on the unselected word lines after beginning to increase the first voltage on the first dummy word line when the selected word line is an edge word line;

increasing a second voltage on the first dummy word line from the steady state voltage at a second rate that is faster than the first rate in response to the word line that is selected for programming being a middle word line; and increasing respective voltages on the unselected data word lines from the steady state voltage towards respective boosting voltages while increasing the second voltage on the first dummy word line at the second rate.

9. The method of claim 8, wherein increasing the respective voltages on unselected data word lines towards the respective boosting voltages while increasing the second voltage on the first dummy word line at the second rate comprises:

beginning to increase the second voltage on the first dummy word line at the same time as beginning to increase the boosting voltage on unselected word lines when the selected word line is a middle word line.

10. The method of claim 8, wherein increasing the first voltage on the first dummy word line at the first rate comprises:

ramping the first voltage on the first dummy word line at the first rate only when a program loop count with respect to the selected word line is greater than or equal to a threshold.

11. The method of claim 10, further comprising:

ramping the second voltage on the first dummy word line at the second rate when the selected word line is an edge word line and when the program loop count is less than the threshold.

12. The method of claim 11, wherein increasing the second voltage on the first dummy word line at the second rate comprises:

ramping the second voltage on the first dummy word line at the second rate for all program loop counts with respect to the selected word line.

13. The method of claim 8, wherein increasing the respective voltages on unselected data word lines towards the respective boosting voltages while increasing the first voltage on the first dummy word line at the first rate comprises:

detecting a voltage on the first dummy word line with a voltage detection circuit; and beginning to increase the respective voltages on the unselected data word lines when the first voltage on the first dummy word line reaches a target voltage.

14. The method of claim 8, wherein increasing the respective voltages on unselected data word lines towards the respective boosting voltages while increasing the first voltage on the first dummy word line at the first rate comprises:

beginning to increase the respective voltages on the unselected data word lines at a pre-determined time after beginning to increase the first voltage on the first dummy word line.

15. A non-volatile storage system, comprising:

a plurality of bit lines;

a common source line;

a plurality of NAND strings, each comprising a set of data non-volatile memory cells, a drain side select gate, a source side select gate, one or more first dummy memory cells between the drain side select gate and the set of data non-volatile memory cells and one or more second dummy memory cells between the source side select gate and the set of data non-volatile memory cells;

a plurality of word lines associated with the plurality of NAND strings, the plurality of word lines comprising one or more first dummy word lines connected to respective ones of the one or more first dummy memory cells of each of the plurality of NAND strings, one or more second dummy word lines connected to respective ones of the one or more second dummy memory cells of each of the plurality of NAND strings, and a plurality of data word lines connected to respective ones of the set of data non-volatile memory cells, the plurality of data word lines comprising one or more first edge word lines neighboring the one or more first dummy word lines, one or more second edge word lines neighboring the one or more second dummy word lines, and a group of middle word lines between the first and second edge word lines; and means for applying a first voltage that has a first slope to an individual one of the one or more first dummy word lines in response to the word line that is selected for programming being a first edge word line;

means for beginning to increase respective voltages on unselected data word lines from a steady state voltage towards respective boosting voltages after beginning to apply the first voltage on the individual dummy word line but prior to the first voltage on the individual dummy word line stabilizing in response to the word line that is selected for programming being the first edge word line;

means for applying a second voltage that has a second slope that is greater than the first slope to the individual one or more dummy word lines in response to the word line that is selected for programming being a middle word line; and means for increasing respective voltages on the unselected data word lines from the steady state voltage towards respective boosting voltages while applying the second voltage that has a second slope to the individual dummy word line.

16. The non-volatile storage system of claim 15, further comprising:
  means for applying the voltage that has the first slope to the individual dummy word line only when a program loop count with respect to the selected word line is greater than or equal to a threshold.

17. The non-volatile storage system of claim 15, further comprising:
  means for applying a voltage that has a third slope to a particular one of the one or more second dummy word lines in response to the word line that is selected for programming being a second edge word line;
  means for increasing respective voltages on unselected data word lines from the steady state voltage towards respective boosting voltages while applying the voltage that has the third slope to the particular dummy word line;
  means for applying a voltage that has a fourth slope that is greater than the third slope to the particular dummy word line in response to the word line that is selected for programming being a middle word line; and
  means for increasing respective voltages on the unselected data word lines from the steady state voltage towards respective boosting voltages while applying the voltage that has a fourth slope to the particular dummy word line.

18. A non-volatile storage system, comprising:
  a plurality of strings of non-volatile memory cells;
  a plurality of word lines associated with the plurality of strings of non-volatile memory cells, the plurality of word lines comprising a dummy word line and a plurality of data word lines, the plurality of data word lines comprising one or more edge word lines and a group of middle word lines; and
  a control circuit in communication with the plurality of word lines, the control circuit configured to:
    increase a voltage on the dummy word line from a steady state voltage to a first dummy word line voltage at a first rate in response to both the data word line that is selected for programming being an edge word line and a program loop count with respect to the selected word line being greater than or equal to a threshold;
    increase respective voltages on unselected data word lines from the steady state voltage towards respective boosting voltages while the voltage on the dummy word line increases towards the first dummy word line voltage;
    increase a voltage on the dummy word line from the steady state voltage to a second dummy word line voltage at a second rate that is faster than the first rate in response to the data word line that is selected for programming being a middle word line or the program loop count with respect to the selected word line being less than the threshold; and
    increase respective voltages on the unselected data word lines from the steady state voltage towards respective boosting voltages while the voltage on the dummy word line increases towards the second dummy word line voltage.

19. A non-volatile storage system, comprising:
  a plurality of strings of non-volatile memory cells;
  a plurality of word lines associated with the plurality of strings of non-volatile memory cells, the plurality of word lines comprising a dummy word line and a plurality of data word lines, the plurality of data word lines comprising one or more edge word lines and a group of middle word lines; and
  a control circuit in communication with the plurality of word lines, the control circuit configured to:
    increase a voltage on the dummy word line from a steady state voltage to a first dummy word line voltage at a first rate when the data word line that is selected for programming is an edge word line, including apply a voltage waveform that has a first slope to the dummy word line;
    increase respective voltages on unselected data word lines from the steady state voltage towards respective boosting voltages after the control circuit begins to increase the voltage on the dummy word line and while the voltage on the dummy word line increases towards the first dummy word line voltage;
    increase a voltage on the dummy word line from the steady state voltage to a second dummy word line voltage at a second rate that is faster than the first rate when the data word line that is selected for programming is a middle word line, including apply a voltage waveform that has a second slope to the dummy word line, wherein the second slope is greater than the first slope, wherein the first dummy word line voltage and the second dummy word line voltage have the same magnitude; and
    increase respective voltages on the unselected data word lines from the steady state voltage towards respective boosting voltages while the voltage on the dummy word line increases towards the second dummy word line voltage.

20. A non-volatile storage system, comprising:
  a plurality of strings of non-volatile memory cells;
  a plurality of word lines associated with the plurality of strings of non-volatile memory cells, the plurality of word lines comprising a dummy word line and a plurality of data word lines, the plurality of data word lines comprising one or more edge word lines and a group of middle word lines;
  a voltage detection circuit configured to detect a voltage on the dummy word line; and
  a control circuit in communication with the plurality of word lines, the control circuit configured to:
    increase a voltage on the dummy word line from a steady state voltage to a first dummy word line voltage at a first rate when the data word line that is selected for programming is an edge word line;
    increase respective voltages on unselected data word lines from the steady state voltage towards respective boosting voltages while the voltage on the dummy word line increases towards the first dummy word line voltage, including begin to increase the respective voltages on unselected data word lines from the steady state voltage towards the respective boosting voltages in response to the voltage on the dummy word line reaching a target voltage;
    increase a voltage on the dummy word line from the steady state voltage to a second dummy word line voltage at a second rate that is faster than the first rate when the data word line that is selected for programming is a middle word line; and
    increase respective voltages on the unselected data word lines from the steady state voltage towards respective boosting voltages while the voltage on the dummy word line increases towards the second dummy word line voltage.

\* \* \* \* \*